US009012034B2

(12) United States Patent
Kinoshita et al.

(10) Patent No.: US 9,012,034 B2
(45) Date of Patent: Apr. 21, 2015

(54) ORGANIC ELECTROLUMINESCENCE ELEMENT

(75) Inventors: Masaru Kinoshita, Kanagawa (JP); Manabu Tobise, Kanagawa (JP)

(73) Assignee: UDC Ireland Limited, Dublin (IE)

(*) Notice: Subject to any disclaimer, the term of this patent is extended or adjusted under 35 U.S.C. 154(b) by 1157 days.

(21) Appl. No.: 11/902,891

(22) Filed: Sep. 26, 2007

(65) Prior Publication Data

US 2008/0174236 A1 Jul. 24, 2008

(30) Foreign Application Priority Data

Sep. 28, 2006 (JP) ................................ 2006-265987

(51) Int. Cl.
*H01J 1/63* (2006.01)
*C09K 11/06* (2006.01)
*H05B 33/14* (2006.01)
*H01L 51/00* (2006.01)
*H01L 51/50* (2006.01)
*H01L 51/52* (2006.01)

(52) U.S. Cl.
CPC .......... *C09K 11/06* (2013.01); *C09K 2211/1007* (2013.01); *C09K 2211/1011* (2013.01); *C09K 2211/1014* (2013.01); *C09K 2211/1029* (2013.01); *C09K 2211/1033* (2013.01); *C09K 2211/1044* (2013.01); *C09K 2211/1088* (2013.01); *C09K 2211/1092* (2013.01); *C09K 2211/182* (2013.01); *C09K 2211/185* (2013.01); *H01L 51/006* (2013.01); *H01L 51/0067* (2013.01); *H01L 51/0071* (2013.01); *H01L 51/0085* (2013.01); *H01L 51/0089* (2013.01); *H01L 51/5012* (2013.01); *H01L 51/5016* (2013.01); *H01L 51/5096* (2013.01); *H01L 51/5237* (2013.01); *H01L 51/5265* (2013.01); *H01L 51/5278* (2013.01); *H01L 2251/552* (2013.01); *H05B 33/14* (2013.01)

(58) Field of Classification Search
USPC ........................................................ 428/690
See application file for complete search history.

(56) References Cited

U.S. PATENT DOCUMENTS

| 6,603,150 | B2 | 8/2003 | Liao et al. | |
|---|---|---|---|---|
| 2002/0197511 | A1* | 12/2002 | D'Andrade et al. | 428/690 |
| 2004/0189190 | A1* | 9/2004 | Suzuri et al. | 313/504 |

(Continued)

FOREIGN PATENT DOCUMENTS

| JP | 6-310275 A | 11/1994 |
|---|---|---|
| JP | 8-162273 A | 6/1996 |

(Continued)

OTHER PUBLICATIONS

Kido, J. et al.; Science, vol. 267, No. 3, pp. 1332-1334 (1995).

*Primary Examiner* — J. L. Yang
(74) *Attorney, Agent, or Firm* — Riverside Law LLP

(57) ABSTRACT

An organic electroluminescence element includes at least a light-emitting layer between a pair of electrodes, wherein the light-emitting layer is divided into at least three layers, an intermediate layer containing an electron blocking material or a hole blocking material is disposed between the divided light-emitting layers, an Ea value of the electron blocking material is smaller than an Ea value of a host material of the divided light-emitting layer adjacent on a cathode side or an Ip value of the hole blocking material is larger than an Ip value of a host material of the divided light-emitting layer adjacent on the anode side of the intermediate layer, and a difference of ΔEa or ΔIp is controlled to specific range.

10 Claims, 2 Drawing Sheets

(56) References Cited

U.S. PATENT DOCUMENTS

2005/0074629 A1* 4/2005 Forrest et al. .............. 428/690
2006/0244370 A1* 11/2006 Tyan et al. .................. 313/506
2007/0085474 A1* 4/2007 Spindler et al. ............. 313/506

FOREIGN PATENT DOCUMENTS

| | | |
|---|---|---|
| JP | 2003-045676 A | 2/2003 |
| JP | 2003-123984 A | 4/2003 |

* cited by examiner

ORGANIC ELECTROLUMINESCENCE ELEMENT

CROSS-REFERENCE TO RELATED APPLICATION

This application claims priority under 35 USC 119 from Japanese Patent Application No. 2006-265987, the disclosure of which is incorporated by reference herein.

BACKGROUND OF THE INVENTION

1. Field of the Invention

The present invention relates to an organic electroluminescence element which has improved external quantum efficiency, and in particular, to an organic electroluminescence element which can be effectively applied to a surface light source for a full color display, a backlight, an illumination light source or the like; or a light source array for a printer or the like.

2. Description of the Related Art

An organic electroluminescence element (hereinafter, referred to as an "organic EL element" in some cases) is composed of a light emitting layer or a plurality of functional layers containing a light emitting layer, and a pair of electrodes sandwiching these layers. The organic electroluminescence element is a device for obtaining luminescence by utilizing at least either one of luminescence from excitons each of which is obtained by recombining an electron injected from a cathode with a hole injected from an anode to produce the exciton, or luminescence from excitons of other molecules produced by energy transmission from the above-described excitons.

Heretofore, an organic electroluminescence element has been developed by using a laminate structure from integrated layers in which each layer is functionally differentiated, whereby brightness and device efficiency are remarkably improved. For example, it is described in "Science", vol. 267, No. 3, page 1332, (1995) that a two-layer laminated type device obtained by laminating a hole transport layer and a light emitting layer also functioning as an electron transport layer; a three-layer laminated type device obtained by laminating a hole transport layer, a light emitting layer, and an electron transport layer; and a four-layer laminated type device obtained by laminating a hole transport layer, a light emitting layer, a hole blocking layer, and an electron transport layer have been frequently used.

However, many problems still remain for putting organic electroluminescence elements to practical use. First, there is a need to attain a high external quantum efficiency, and second, there is a need to attain a high driving durability.

For example, there has been disclosed in JP-A No. 2003-123984 an attempt to dispose an interface layer of 0.1 nm to 5 nm as a barrier layer between a light emitting layer and a hole transport layer and retard the migration of holes, to thereby control the migration balance between holes and electrons and enhance the external quantum efficiency. However, this means potentially involves a problem of lowering the brightness and increasing the driving voltage since the migration of all of the carriers is lowered, as well as a problem of lowering the driving durability, since the time that the carriers stay in the device is made longer.

Further, a configuration in which light emitting units each containing a light emitting layer and a functional layer are stacked in a multi-layer structure is known. For example, JP-A No. 6-310275 discloses a configuration in which plural light emitting units including an organic electroluminescence element are isolated by an insulation layer, and opposing electrodes are provided for each of the light emitting units. However, in this configuration, since the insulation layer and the electrode between the light emitting units hinder the extraction of light emission, light emitted from each of the light emitting units cannot substantially be utilized sufficiently. Further, this is not a means for improving the low external quantum efficiency inherent to each of the light emitting units.

JP-A No. 2003-45676 discloses a multi-photon type organic EL device, in which a plurality of light emitting layers are isolated from each other by an electrically insulating charge generation layer. However, in this configuration as well, the light emitting units are merely stacked in a plurality, and this cannot provide a means for improving the low external quantum efficiency inherent to each of the light emitting units.

Compatibility between high external quantum efficiency and high driving durability is extremely important for designing an organic electroluminescence element which is practically useful, and this is a subject for which improvement is continuously demanded.

SUMMARY OF THE INVENTION

The present invention has been made in view of the above circumstances and provides an organic electroluminescence element comprising at least a light-emitting layer interposed between a pair of electrodes, wherein:

1) the light-emitting layer is divided into at least three layers in a thickness direction thereof, wherein each of the divided light-emitting layers independently contains a light-emitting material and a host material, and an intermediate layer containing an electron blocking material is disposed between the divided light-emitting layers;

2) an Ea (electron affinity) value of the electron blocking material contained in the intermediate layer is smaller than an Ea value of the host material contained in the divided light-emitting layer adjacent on a cathode side of the intermediate layer; and 3) a difference $\Delta Ea_2$ value between an Ea value of the electron blocking material contained in the intermediate layer closer to the anode and an Ea value of a host material contained in the divided light-emitting layer adjacent on the cathode side thereof is larger than a difference $\Delta Ea_1$ value between an Ea value of the electron blocking material contained in the intermediate layer closer to the cathode and an Ea value of the host material contained in the divided light-emitting layer adjacent on the cathode side of the intermediate layer.

A second aspect of the present invention is to provide an organic electroluminescence element comprising at least a light-emitting layer interposed between a pair of electrodes, wherein:

1) the light-emitting layer is divided into at least three layers in a thickness direction thereof, wherein each of the divided light-emitting layers independently contains a light-emitting material and a host material, and an intermediate layer containing a hole blocking material is disposed between the divided light-emitting layers;

2) an Ip (ionization potential) value of the hole blocking material contained in the intermediate layer is larger than an Ip value of the host material contained in the divided light-emitting layer adjacent on an anode side of the intermediate layer; and 3) a difference $\Delta Ip_2$ value between an Ip value of the hole blocking material of the intermediate layer closer to the anode and an Ip value of the host material contained in the divided light-emitting layer adjacent to the anode side thereof is smaller than a difference $\Delta Ip_1$ value between an Ip value of the hole blocking material of the intermediate layer closer to the cathode and an Ip value of the host material contained in the divided light-emitting layer adjacent to the anode side of the intermediate layer.

DETAILED DESCRIPTION OF THE INVENTION

Figure 1:
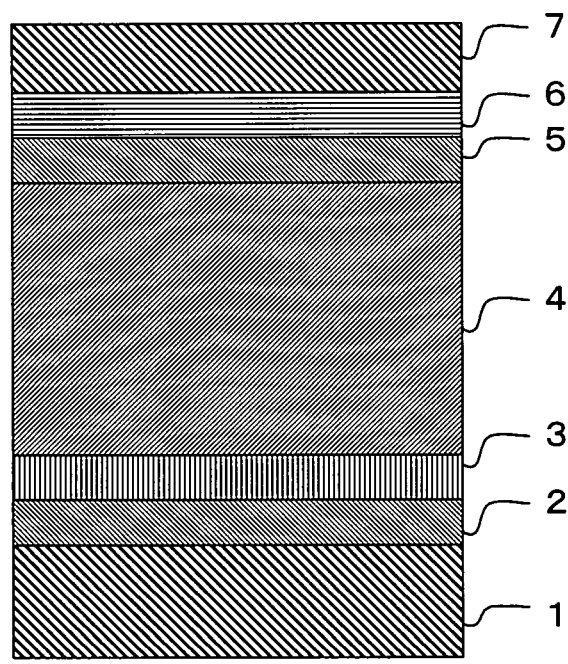
FIG. 1 is a conceptual view of the layer configuration of a comparative electroluminescence element.

The invention is intended to provide a light emitting element that is improved in external quantum efficiency and driving durability.

An organic electroluminescence element in the present invention comprises at least a light-emitting layer interposed between a pair of electrodes, wherein the light-emitting layer is divided into at least three layers in a thickness direction thereof and has at least two conductive intermediate layers containing an electron blocking material respectively disposed between the divided light-emitting layers; an Ea (electron affinity) value of the electron blocking material contained in the intermediate layer adjacent on an anode side of the light-emitting layer is smaller than an Ea value of the host material contained in the light-emitting layer; and the difference thereof is a $\Delta Ea$ value, wherein the intermediate layer closer to the anode has a larger $\Delta Ea$ value than the intermediate layer closer to the cathode has.

The $\Delta Ea$ value in the intermediate layer closer to the anode in the present invention preferably is 0.05 eV to 1.5 eV larger than the $\Delta Ea$ value in the intermediate layer closer to the cathode, and more preferably 0.1 eV to 1.3 eV larger. In a case where a difference in the $\Delta Ea$ value is less than 0.05 eV, it becomes difficult to obtain sufficiently the effects of the present invention, because of diminishing the difference of the electron blocking capacity between the intermediate layer closer to a cathode and intermediate layer closer to an anode. In a case where a difference in the $\Delta Ea$ value exceeds 1.5 eV, an electron blocking effect in the intermediate layer closer to an anode becomes too great resulting in a large accumulation of electrons, and thereby causes degradation in an interface layer. These are not preferable.

Another embodiment in the present invention is an organic electroluminescence element comprising at least a light-emitting layer interposed between a pair of electrodes, wherein an Ip (ionization potential) value of the hole blocking material contained in the intermediate layer adjacent on a cathode side of the light-emitting layer is larger than an Ip value of the host material contained in the light-emitting layer, and the difference thereof is a $\Delta Ip$ value, wherein the intermediate layer closer to the cathode has a larger $\Delta Ip$ value than the intermediate layer closer to the anode has.

The $\Delta Ip$ value in the intermediate layer closer to the anode in the present invention preferably is 0.05 eV to 1.5 eV smaller than the $\Delta Ip$ value than the intermediate layer closer to the cathode, and more preferably 0.1 eV to 1.3 eV smaller. In a case where a difference in the $\Delta Ip$ value is less than 0.05 eV, it becomes difficult to obtain sufficiently the effects of the present invention, because of diminishing the difference of the hole blocking capacity between the intermediate layer closer to a cathode and intermediate layer closer to an anode. In a case where a difference in the $\Delta Ip$ value exceeds 1.5 eV, a hole blocking effect becomes too great resulting in a large accumulation of holes, and thereby causes degradation in an interface layer. These are not preferable.

When an organic electroluminescence element of the invention is segmented into at least four layers and has at least three intermediate layers, it is sufficient for two arbitrary layers among these to satisfy the foregoing conditions. Preferably, $\Delta Ea$ values of the at least three intermediate layers are sequentially larger in the intermediate layers closer to an anode than in the intermediate layers closer to a cathode. Alternatively, $\Delta Ip$ values of the at least three intermediate layers are sequentially larger in the intermediate layers closer to a cathode than in the intermediate layers closer to an anode.

The present inventors, after earnest study to find means for improvement, found that when a light-emitting layer is segmented into a plurality of thin layers in a thickness direction thereof, an intermediate layer having a charge blocking capacity is disposed between the respective segmented light-emitting layers as an intermediate layer, and in the case of the charge blocking layer being an electron blocking layer, an electron blocking capacity thereof is made larger in the intermediate layer closer to an anode and smaller in the intermediate layer closer to a cathode, and in the case of the charge blocking layer being a hole blocking layer, the hole blocking capacity thereof is made smaller in the intermediate layer closer to an anode and larger in the intermediate layer closer to a cathode, an improvement can be achieved. That is, a distance between regions where electrons and holes are localized is shortened, whereby a recombination speed is increased, and the leakage of the carriers from the respective light-emitting layers is improved, whereby the emission efficiency is improved. Furthermore, since it is an intermediate layer that connects light-emitting units of the respective thin layers, the driving resistance is not greatly increased and light generated in the respective elements can be efficiently extracted to the outside.

Preferably, a light-emitting material can be further contained in the intermediate layer, whereby the layer can emit light to be able to obtain brighter emission.

Preferably, a light-emitting material that the light-emitting layer contains is a phosphorescent material. More preferably, a light-emitting material that the intermediate layer contains is a phosphorescent material.

The invention provides an organic electroluminescence element outstandingly improved both in external quantum efficiency and in driving durability.

1. Segmentation of Light Emitting Layer

The organic EL element in the present invention comprises at least a light emitting layer interposed between a pair of electrodes, wherein the light emitting layer is divided along the thickness direction thereof and an intermediate layer is positioned between each of the divided light emitting layers. The intermediate layer which contains a charge blocking material functions as a charge blocking layer. In the present application, the finely divided light emitting layers, into which the light emitting layer is divided in the thickness direction thereof, are sometimes referred to as "unit light emitting layers".

The thickness of the unit light emitting layer in the invention is preferably 2 nm to 50 nm, more preferably 2 nm to 20 nm, and further preferably 2 nm to 10 nm.

The light emitting layer in the invention is finely divided along the thickness direction thereof preferably into 3 layers to 30 layers, and more preferably into 4 layers to 15 layers.

When the light-emitting layer is divided into three unit light-emitting layers, two conductive intermediate layers are provide, wherein ΔEa is largest at an anode side than at a cathode side, such that $\Delta Ea_2$ of the intermediate layer closer to the anode is larger than $\Delta Ea_1$ that is ΔEa of the intermediate layer closer to the cathode, such as $\Delta Ea_2 > \Delta Ea_1$. A difference between the $\Delta Ea_2$ value and the $\Delta Ea_1$ value is preferably 0.05 eV to 1.5 eV, and more preferably 0.1 eV to 1.3 eV. Alternatively, ΔIp is smaller at an anode side than at a cathode side, such that $\Delta Ip_2$ of the intermediate layer closer to the anode is smaller than $\Delta Ip_1$ that is ΔIp of the intermediate layer closer to the cathode, such as $\Delta Ip_2 < \Delta Ip_1$. A difference between the $\Delta Ip_1$ value and the $\Delta Ip_2$ value is preferably 0.05 eV to 1.5 eV, and more preferably 0.1 eV to 1.3 eV.

When the light-emitting layer is divided into four unit light-emitting layers, three intermediate layers are contained, wherein ΔEa preferably becomes larger in a direction from the cathode toward the anode, such that (anode) $\Delta Ea_3 > \Delta Ea_2 > \Delta Ea_1$ (cathode).

ΔIp preferably becomes smaller in a direction from the cathode toward the anode, such that (anode) $\Delta Ip_3 < \Delta Ip_2 < \Delta Ip_1$ (cathode).

The unit light emitting layers in the invention are connected by an intermediate layer. Preferably, the element comprises at least four unit light emitting layers and three intermediate layers connecting them along the thickness direction thereof.

The unit light emitting layer in the present invention contains at least a light emitting material and a host material. The unit light emitting layer preferably contains a phosphorescence material as the light emitting material. The light emitting material will be described in more detail afterwards The intermediate layer in the present invention preferably contains a light emitting material. The intermediate layer in the present invention contains a charge blocking material. Preferably, a hole blocking material or an electron blocking material is contained as the charge blocking material.

Preferably, the intermediate layer contains a phosphorescence material as the light emitting material.
(Intermediate Layer)

The intermediate layer in the invention will be described in more detail.

The intermediate layer in the invention functions as a charge blocking layer.

The intermediate layer which operates as a charge blocking layer in the invention is a layer having a function of suppressing electrons transported from a cathode to a light emitting layer from passing through to an anode, or suppressing holes transported from an anode to the light emitting layer from passing through to the cathode, but this is not a layer for completely inhibiting the migration of carriers.

Preferably, the intermediate layer contains a light emitting material.
1) Electron Blocking Material in the Intermediate Layer In the invention, an Ea value of an electron blocking material of the intermediate layer adjacent on an anode side of the unit light-emitting layer is smaller than an Ea value of a host material of the unit light-emitting layer, and the difference thereof is a ΔEa value that is larger in an intermediate layer closer to an anode than in an intermediate layer closer to a cathode.

ΔEa=Ea(host material)−Ea(electron blocking material)

ΔEa>0

When an intermediate layer closer to an anode is expressed by an intermediate layer 2 and an intermediate layer closer to the cathode is expressed by an intermediate layer 1, $\Delta Ea_2 > \Delta Ea_1$ holds.

When there are at least three conductive intermediate layers, a ΔEa value of an additional intermediate layer is preferably located between $\Delta Ea_1$ and $\Delta Ea_2$.

An electron blocking material satisfying these conditions is not particularly limited, as far as it satisfies the relationship of ΔEa explained above. Specific examples thereof include pyrrole derivatives, carbazole derivatives, azacarbazole derivatives, indole derivatives, azaindole derivatives, pyrazole derivatives, triazole derivatives, oxazole derivatives, oxadiazole derivatives, imidazole derivatives, polyarylalkane derivatives, pyrazoline derivatives, pyrazolone derivatives, phenylene diamine derivatives, arylamine derivatives, amino-substituted chalcone derivatives, styryl anthracene derivatives, fluorenone derivatives, hydrazone derivatives, stilbene derivatives, silazane derivatives, aromatic tertiary amine compounds, styryl amine compounds, aromatic dimethylidene compounds, porphyrin compounds, organic silane derivatives and the like.
2) Hole Blocking Material in the Intermediate Layer In the invention, an Ip value of a hole blocking material of the intermediate layer adjacent on a cathode side of a unit light-emitting layer is larger than a Ip value of a host material of the unit light-emitting layer, and the difference thereof is a ΔIp value that is larger in the intermediate layer closer to a cathode than in the intermediate layer closer to the anode.

ΔIp=Ip(hole blocking material)−Ip(host material)

ΔIp>0

When an intermediate layer closer to a cathode is expressed by an intermediate layer 1 and an intermediate layer closer to an anode is expressed by an intermediate layer 2, $\Delta Ip_1 > \Delta Ip_2$ holds.

When there are at least three conductive intermediate layers, a ΔIp value of an additional intermediate layer is preferably located between $\Delta Ip_1$ and $\Delta Ip_2$.

A hole blocking material satisfying these conditions is not particularly limited, as far as it satisfies the relationship of ΔIp explained above. Specific examples thereof include pyridine, pyrimidine, triazine, imidazole, triazole, oxazole, oxadiazole, fluorenone, anthraquinodimethane, anthrone, diphenylquinone, thiopyran dioxide, carbodiimide, fluorenylidenemethane, distyrylpyrazine, fluorine-substituted aromatic compounds; heterocyclic tetracarboxylic anhydrides of naphthalene, perylene and the like; phthalocyanine and derivatives thereof (which may form a condensed ring with another ring); and various kinds of metal complexes typified by metal complexes of 8-quinolinol derivatives and metal complexes with metal phthalocyanine, benzooxazole or benzothiazole as a ligand.
3) Constitution of Intermediate Layer In general, the constituent ratio of materials which constitutes the intermediate layer preferably comprises from 60% by weight to 100% by weight of the charge blocking material, and from 0% by weight to 40% by weight of the light emitting material; and further preferably, from 70% by weight to 100% by weight of the charge transport material, and from 0% by weight to 30% by weight of the light emitting material; and even more preferably, from 80% by weight to 100% by weight of the charge blocking material, and 0% by weight to 20% by weight of the light emitting material.

In a case where the charge blocking material is less than 60% by weight, since the charge blocking performance is scarcely exhibited, this results in a problem in that the effect of improving the external quantum efficiency is not obtained, which is not preferred.

4) Thickness of Intermediate Layer

For lowering the driving voltage, in general, the thickness of the intermediate layer in the invention is preferably from 3 nm to 100 nm, and more preferably from 5 nm to 50 nm.

In a case where the thickness exceeds 100 nm, migration of carriers is hindered greatly to result in a problem of increasing the driving voltage, which is not preferred. In a case where the thickness is less than 3 nm, the layer is not formed sufficiently and partially or entirely loses the function as the charge blocking layer, which is not preferred.

5) Number of Intermediate Layers

The number of layers of the intermediate layer in the invention is preferably from 2 to 29, and further preferably from 3 to 14.

(Division of Light Emitting Layer)

Segmentation of the light emitting layer in the invention is to be explained in detail. The composition of the respective light emitting layers will be explained in detail in the explanation of the light emitting layer which will be described later.

In the constitution of the invention, the light emitting layer is finely divided into three or more unit light emitting layers in the direction of the thickness, and the light emitting layer is preferably finely divided into from 3 to 30 unit light emitting layers, and more preferably finely divided into from 4 to 15 unit light emitting layers.

The thickness of the unit light emitting layer finely divided in the direction of the thickness is extremely thin, and is 2 nm to 50 nm, more preferably from 2 nm to 20 nm, and further preferably from 2 nm to 10 nm.

In a case where the thickness of the unit light emitting layer is less than 2 nm, light emission is not sufficient, and in a case where the thickness of the unit light emitting layer exceeds 50 nm, the effect of fine segmentation of light emitting layer is not obtained, which is not preferred.

A plurality of light emitting layers in the invention may be layers exhibiting light emission identical with each other or exhibiting light emission different from each other with respect to wavelengths of the emitted light. For example, in a case of layers exhibiting light emission having identical wavelengths, light emission at high brightness can be taken out. On the other hand, in a case of light emission having different wavelengths from each other, it is possible to obtain light emission of a desired tone, or to obtain white light emission, depending on the combination of respective light emission wavelengths.

(Divided Layer Constitution)

The layer constitution is to be described with reference to the drawings. In the illustrated constitution in FIGS. 1 to 3, only the layers necessary for describing the intention of the present application are shown. Those elements necessary for the organic electroluminescence element but not directly necessary for the explanation of the invention are omitted.

FIG. 1 is a schematic view of the layer constitution of a comparative organic electroluminescence element. An anode electrode 1 comprising ITO, etc. is present on a substrate (not illustrated), and a hole injection layer 2, a hole transport layer 3, a light emitting layer 4, an electron transport layer 5, an electron injection layer 6, and a cathode 7 made of a metal such as aluminum are disposed in order thereon.

Figure 2:
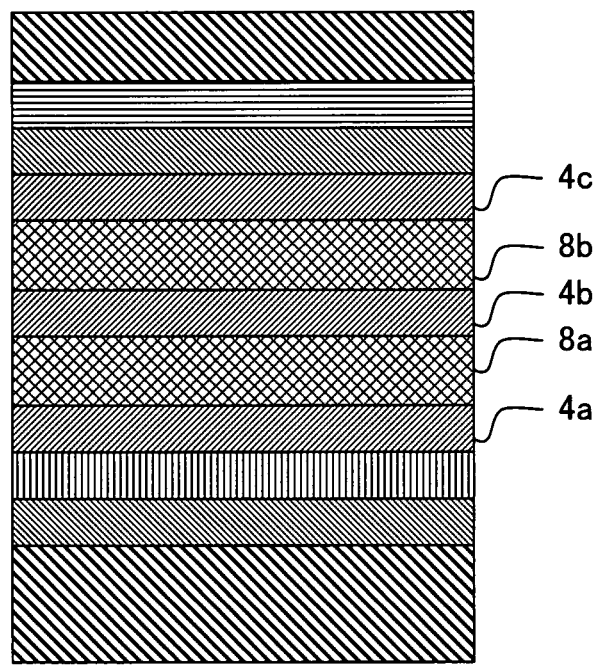
FIG. 2 is a conceptual view of one embodiment of an electroluminescence element according to the invention in which a light emitting layer is segmented to three unit light emitting layers, and an intermediate layer is disposed between each of unit light emitting layers.

FIG. 2 shows an example of an organic electroluminescence element of the invention in which a light emitting layer is divided into a first unit light emitting layer 4a, and a second unit light emitting layer 4b and a third unit light emitting layer 4c, and an intermediate layers 8a and 8b are disposed therebetween. The total thickness including the three light emitting layers and the two intermediate layers in FIG. 2 is substantially identical with that for the light emitting layer 4 in FIG. 1.

Figure 3:
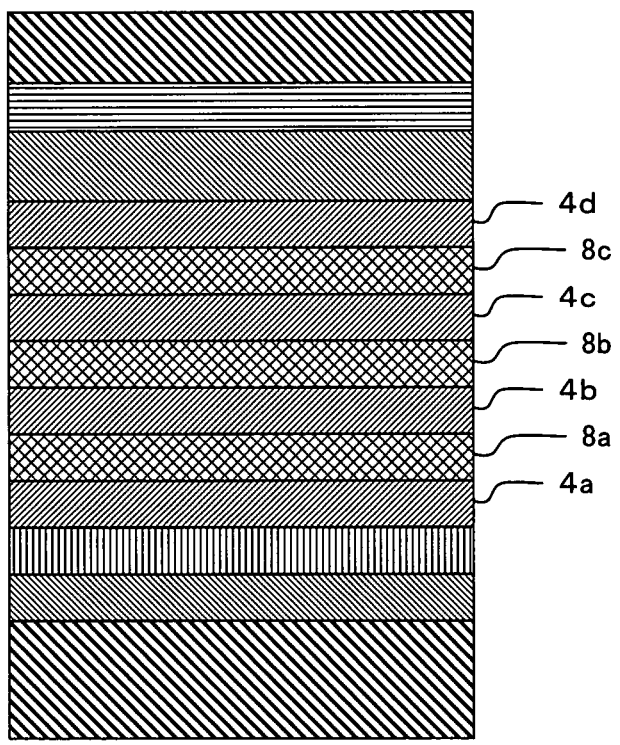
FIG. 3 is a conceptual view of a layer configuration of another embodiment of an electroluminescence element according to the present invention in which a light emitting layer is divided into four layers, and an intermediate layer is disposed between each of the four layers.

FIG. 3 shows another example of the layer constitution of the invention. The light emitting layer is divided into four unit light emitting layers 4a, 4b, 4c and 4d, and intermediate layers 8a, 8b, and 8c are respectively disposed between the respective divided light emitting layers. The intermediate layers, 8a, 8b and 8c each contain a hole blocking material. The total thickness including the divided four light emitting layers 4a, 4b, 4c and 4d and three intermediate layers 8a, 8b, and 8c in FIG. 3 is substantially equal with that for the light emitting layer in FIG. 1.

2. Organic Electroluminescence Element

As a lamination pattern of the organic compound layers according to the present invention, it is preferred that the layers are laminated in the order of a hole injection layer, a light emitting layer, and electron transport layer from the anode side. Moreover, a hole transport layer between the hole injection layer and the light emitting layer and/or an electron transporting intermediate layer between the light emitting layer and the electron transport layer may be provided. In addition, a hole transporting intermediate layer may be provided in between the light emitting layer and the hole transport layer, and similarly, an electron injection layer may be provided in between the cathode and the electron transport layer.

The preferred modes of the organic compound layer in the organic electroluminescence element of the present invention are as follows. (1) An embodiment having a hole injection layer, a hole transport layer (the hole injection layer may also have the role of the hole transport layer), a hole transporting intermediate layer, a light emitting layer, an intermediate layer, an electron transport layer, and an electron injection layer (the electron transport layer may also have the role of the electron injection layer) in this order from the anode side; (2) an embodiment having a hole injection layer, a hole transport layer (the hole injection layer may also have the role of the hole transport layer), a light emitting layer, an intermediate layer, an electron transporting immediate layer, an electron transport layer, and an electron injection layer (the electron transport layer may also have the role of the electron injection layer); and (3) an embodiment having a hole injection layer, a hole transport layer (the hole injection layer may also have the role of the hole transport layer), a hole transporting intermediate layer, a light emitting layer, an intermediate layer, an electron transporting intermediate layer, an electron transport layer, and an electron injection layer (the electron transport layer may also have the role of the electron injection layer).

The above-described hole transporting intermediate layer preferably has at least either a function for accelerating the injection of holes into the light emitting layer, or a function for blocking electrons.

Furthermore, the above-described electron transporting intermediate preferably layer has at least either a function for accelerating the injection of electrons into the light emitting layer, or a function for blocking holes.

Moreover, at least either of the above-described hole transporting intermediate layer and the electron transporting intermediate layer preferably has a function for blocking excitons produced in the light emitting layer.

In order to realize effectively the functions for accelerating the injection of hole, or the injection of electrons, and the functions for blocking holes, electrons, or excitons, it is preferred that the hole transporting intermediate layer and the electron transporting intermediate layer are adjacent to the light emitting layer.

The respective layers mentioned above may be separated into a plurality of secondary layers.

An organic EL element of the invention may have a resonator structure. For instance, on a transparent substrate, a multi-layered film mirror that is made of a plurality of laminated films different in the refractive index, a transparent or translucent electrode, a light emitting layer and a metal electrode are stacked. Light generated in the light emitting layer repeats reflections between the multi-layered film mirror and the metal electrode as reflective plate to resonate.

In another preferable embodiment, on a transparent substrate, a transparent or translucent electrode and a metal electrode, respectively, work as a reflective plate and light generated in a light emitting layer repeats reflections therebetween to resonate.

In order to form a resonant structure, an optical path determined from effective refractive indices of two reflective plates and the refractive indices and thicknesses of the respective layers between the reflective plates is controlled so as to be an optimum value to obtain a desired resonant wave length. A calculation equation in the case of the first embodiment is described in JP-A No. 9-180883. A calculation equation in the case of the second embodiment is described in JP-A No. 2004-127795.

The respective layers that constitute organic compound layers in the present invention can be preferably formed by any method of dry layering methods such as a vapor deposition method and a sputtering method, a transferring method, a printing method, a coating method, a ink jet method, or a spray method.

Next, the components constituting the electroluminescence element of the present invention will be described in detail.

(Light Emitting Layer)

The light emitting layer is a layer having a function for receiving holes from the anode, the hole injection layer, the hole transport layer or the hole transporting intermediate layer, and receiving electrons from the cathode, the electron injection layer, the electron transport layer, or the electron transporting intermediate layer, and for providing a field for recombination of the holes with the electrons to emit a light.

The light emitting layer of the present invention contains at least a luminescent dopant and a host compound.

The luminescent dopant and the host compound contained in the light emitting layer of the present invention may be either a combination of a fluorescence luminescent dopant in which the luminescence (fluorescence) from a singlet exciton is obtained and the host compound, or a combination of a phosphorescence luminescent dopant in which the luminescence (phosphorescence) from triplet exciton is obtained and the host compound.

The light emitting layer of the present invention may contain two or more types of luminescent dopants for improving color purity and expanding the luminescent wavelength region.

Any of phosphorescent emission materials, fluorescent emission materials and the like may be used as the luminescent dopant in the present invention.

It is preferred that the luminescent dopant in the present invention is one satisfying a relationship between the above-described host compound and the luminescent dopant of 1.2 eV>the difference of Ip between host material and light emitting dopant ($\Delta$Ip)>0.2 eV and/or 1.2 eV>the difference of Ea between host material and light emitting dopant ($\Delta$Ea)>0.2 eV in view of driving durability.

<<Phosphorescence Luminescent Dopant>>

The phosphorescent emission material are not limited specifically, but generally include complexes containing transition metal atoms or lantanoid atoms.

For instance, although the transition metal atoms are not limited, they are preferably ruthenium, rhodium, palladium, tungsten, rhenium, osmium, iridium, or platinum; more preferably rhenium, iridium, and platinum, or even more preferably iridium, or platinum.

Examples of the lantanoid atoms include lanthanum, cerium, praseodymium, neodymium, samarium, europium, gadolinium, terbium, dysprosium, holmium, erbium, thulium, ytterbium, and lutetium, and among these lantanoid atoms, neodymium, europium, and gadolinium are preferred.

Examples of ligands in the complex include the ligands described, for example, in "Comprehensive Coordination Chemistry" authored by G. Wilkinson et al., published by Pergamon Press Company in 1987; "Photochemistry and Photophysics of Coordination compounds" authored by H. Yersin, published by Springer-Verlag Company in 1987; and "YUHKI KINZOKU KAGAKU—KISO TO OUYOU—(Metalorganic Chemistry—Fundamental and Application—)" authored by Akio Yamamoto, published by Shokabo Publishing Co., Ltd. in 1982.

Specific examples of the ligands include preferably halogen ligands (preferably chlorine ligands), aromatic carboxycyclic ligands (e.g., cyclopentadienyl anions, benzene anions, or naphthyl anions and the like), nitrogen-containing heterocyclic ligands (e.g., phenylpyridine, benzoquinoline, quinolinol, bipyridyl, or phenanthroline and the like), diketone ligands (e.g., acetylacetone and the like), carboxylic acid ligands (e.g., acetic acid ligands and the like), alcoholate ligands (e.g., phenolate ligands and the like), carbon monoxide ligands, isonitryl ligands, and cyano ligand, and more preferably nitrogen-containing heterocyclic ligands.

The above-described complexes may be either a complex containing one transition metal atom in the compound, or a so-called polynuclear complex containing two or more transition metal atoms wherein different metal atoms may be contained at the same time.

Among these, specific examples of the luminescent dopants include phosphorescence luminescent compounds described in patent documents such as U.S. Pat. No. 6,303,238B1, U.S. Pat. No. 6,097,147, WO00/57676, WO00/70655, WO01/08230, WO01/39234A2, WO01/41512A1, WO02/02714A2, WO02/15645A1, WO02/44189A1, JP-A No. 2001-247859, Japanese Patent Application No. 2000-33561, JP-A Nos. 2002-117978, 2002-225352, and 2002-235076, Japanese Patent Application No. 2001-239281, JP-A No. 2002-170684, EP1211257, JP-A Nos. 2002-226495, 2002-234894, 2001-247859, 2001-298470, 2002-173674, 2002-203678, 2002-203679, and 2004-357791, Japanese Patent Application Nos. 2005-75340 and 2005-75341, etc.

<<Fluorescence Luminescent Dopant>>

Examples of the above-described fluorescent emission materials include, for example, a benzoxazole derivative, a benzimidazole derivative, a benzothiazole derivative, a styrylbenzene derivative, a polyphenyl derivative, a diphenylbutadiene derivative, a tetraphenylbutadiene derivative, a naphthalimide derivative, a coumarin derivative, a perylene derivative, a perinone derivative, an oxadiazole derivative, an aldazine derivative, a pyralidine derivative, a cyclopentadiene derivative, a bis-styrylanthracene derivative, a quinacridone derivative, a pyrrolopyridine derivative, a thiadiazolopyridine derivative, a styrylamine derivative, aromatic dimethylidene compounds, a variety of metal complexes represented by metal complexes or rare-earth complexes of 8-quinolynol, polymer compounds such as polythiophene, polyphenylene and polyphenylenevinylene, organic silanes, and the like. These compounds may be used singularly or in a combination of two or more.

Among these, specific examples of the luminescent dopants include the following compounds, but it should be noted that the present invention is not limited thereto.

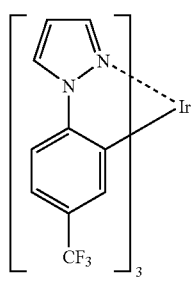
D-1

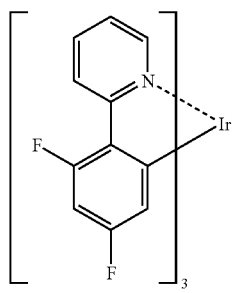
D-2

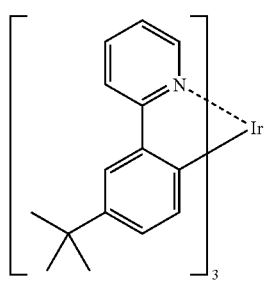
D-3

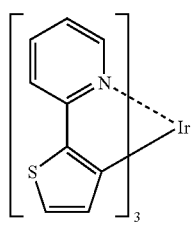
D-4

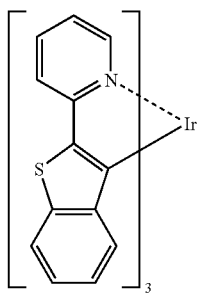
D-5

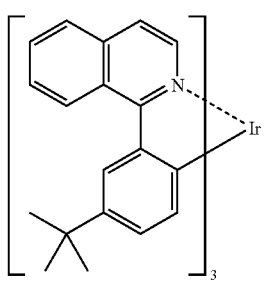
D-6

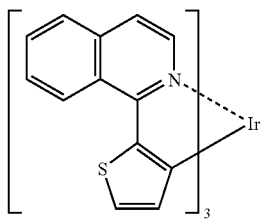
D-7

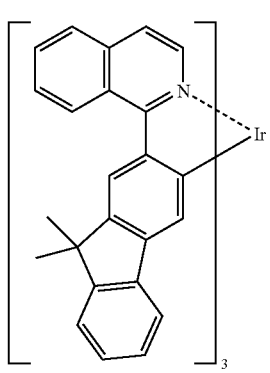
D-8

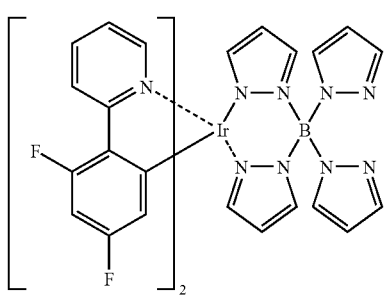
D-9

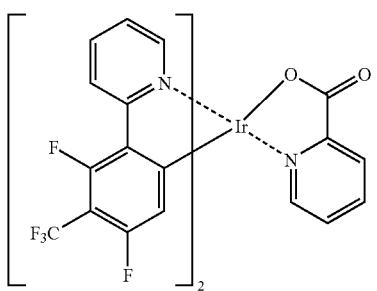 D-10
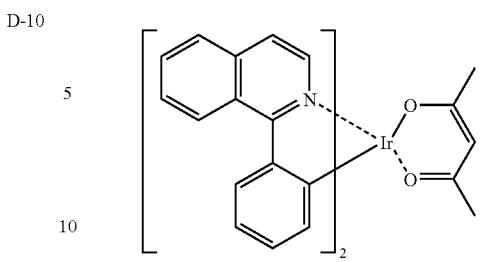 D-15
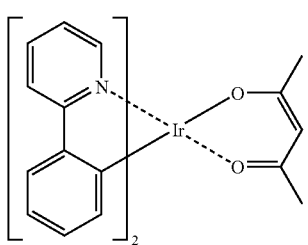 D-11
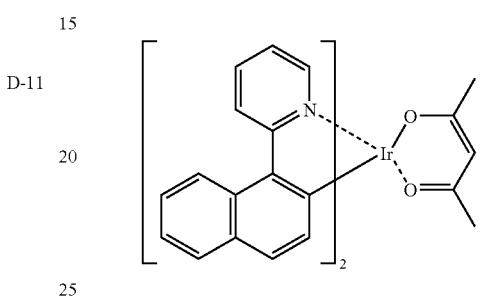 D-16
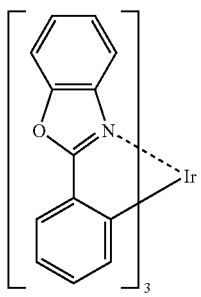 D-12
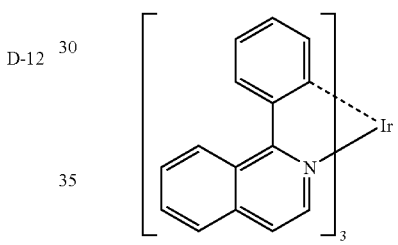 D-17
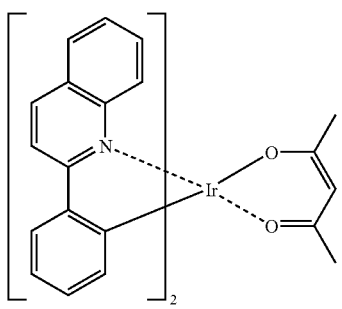 D-13
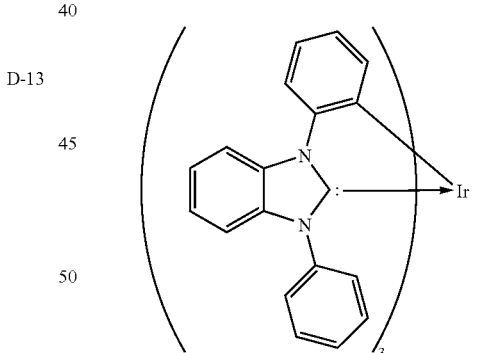 D-18
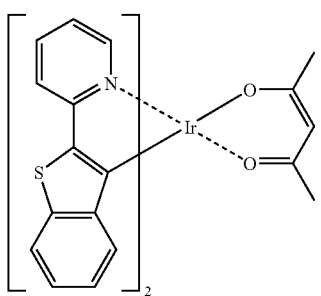 D-14
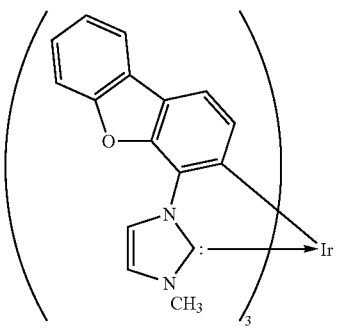 D-19

D-20 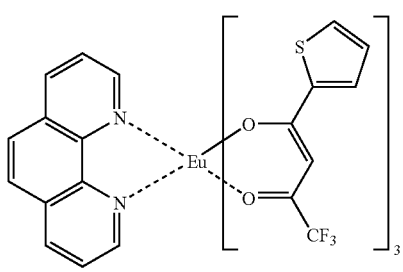
D-25 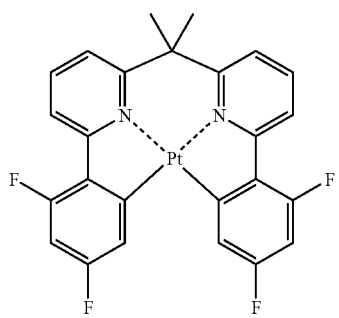
D-21 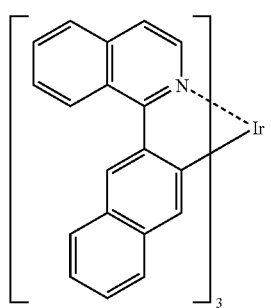
D-26 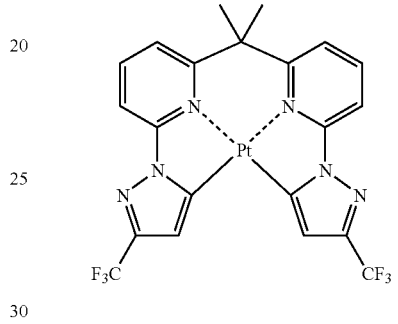
D-22 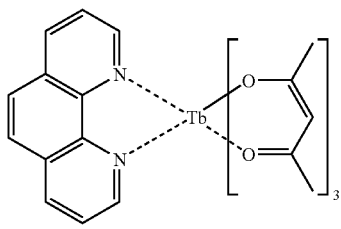
D-27 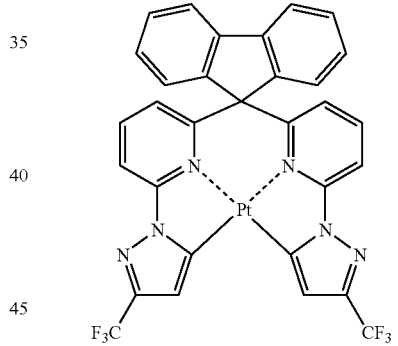
D-23 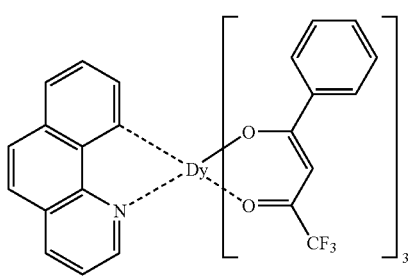
D-28 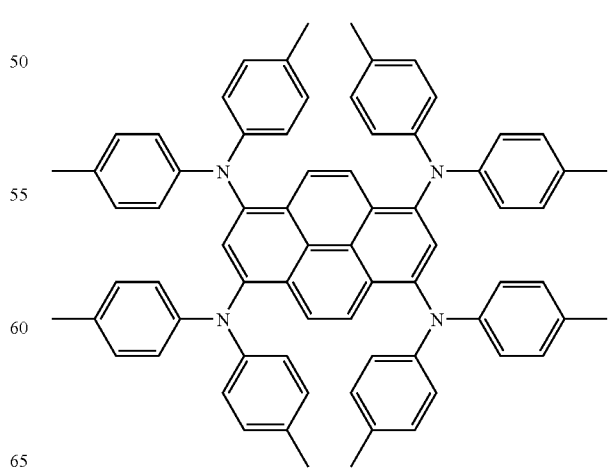
D-24 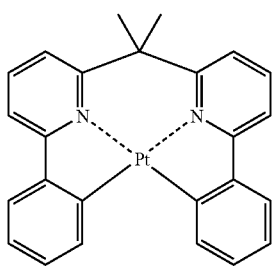

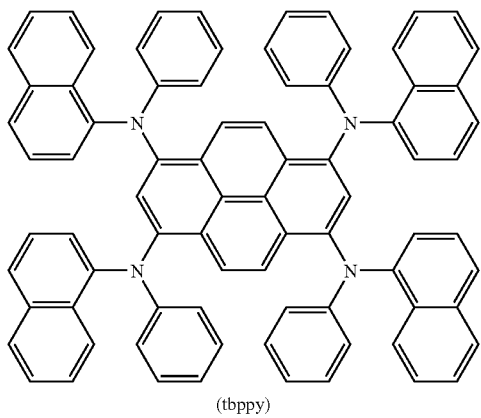
(tbppy)

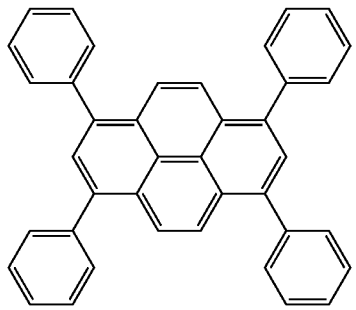

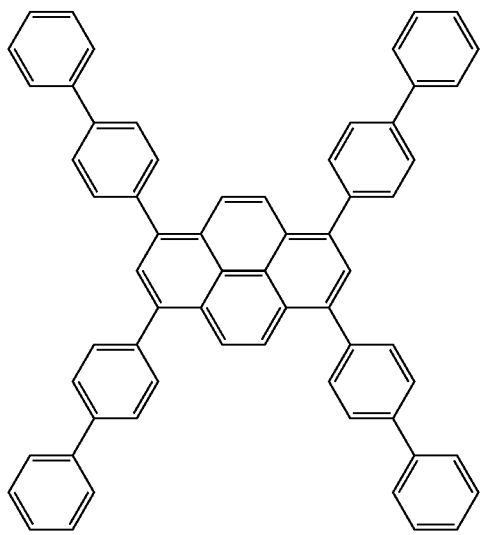

Among the above-described compounds, as the luminescent dopants to be used according to the present invention, D-2 to D-19, and D-24 to D-31 are preferable, D-2 to D-8, D-12, D-14 to D-19, D-24 to D-27, and D-28 to D-31 are more preferable, and D-24 to D-27, and D-28 to D-31 are further preferable in view of external quantum efficiency, and durability.

The luminescent dopant in a light-emitting layer is contained in an amount of 0.1% by weight to 30% by weight with respect to the total mass of the compounds generally forming the light-emitting layer, but it is preferably contained in an amount of 2% by weight to 30% by weight, and more preferably in an amount of 5% by weight to 30% by weight in view of durability and external quantum efficiency.

(Host Material)

As the host materials to be used according to the present invention, hole transporting host materials excellent in hole transporting property (referred to as a "hole transporting host" in some cases) and electron transporting host compounds excellent in electron transporting property (referred to as an "electron transporting host" in some cases) may be used.

<<Hole Transporting Host>>

The hole transporting host used for the organic layer of the present invention preferably has an ionization potential Ip of 5.1 eV to 6.4 eV, more preferably has an ionization potential of 5.4 eV to 6.2 eV, and further preferably has an ionization potential of 5.6 eV to 6.0 eV in view of improvements in durability and decrease in driving voltage. Furthermore, it preferably has an electron affinity Ea of 1.2 eV to 3.1 eV, more preferably of 1.4 eV to 3.0 eV, and further preferably of 1.8 eV to 2.8 eV in view of improvements in durability and decrease in driving voltage.

Specific examples of such hole transporting hosts as mentioned above include pyrrole, carbazole, azacarbazole, indole, azaindole, pyrazole, imidazole, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidine compounds, porphyrin compounds, polysilane compounds, poly (N-vinylcarbazole), aniline copolymers, electric conductive high-molecular oligomers such as thiophene oligomers, polythiophenes and the like, organic silanes, carbon films, derivatives thereof, and the like.

Among these, indole derivatives, carbazole derivatives, azaindole derivatives, azacarbazole derivatives, aromatic tertiary amine compounds, and thiophene derivatives are preferable, and particularly, compounds containing a plurality of carbazole skeletons, indole skeletons and/or aromatic tertiary amine skeletons in a molecule are preferred.

As specific examples of the hole transporting hosts described above, the following compounds may be listed, but the present invention is not limited thereto.

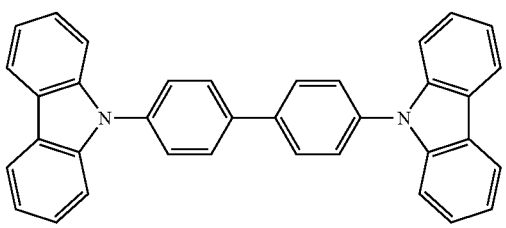

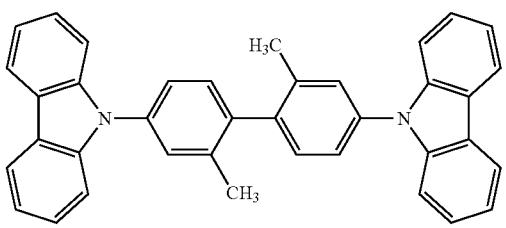

H-3
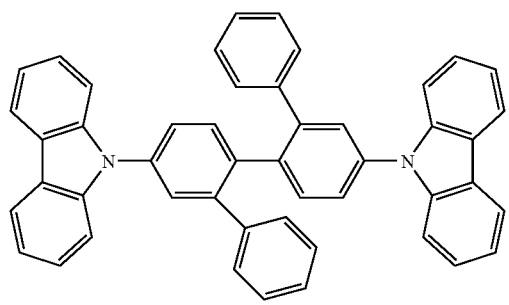
H-4
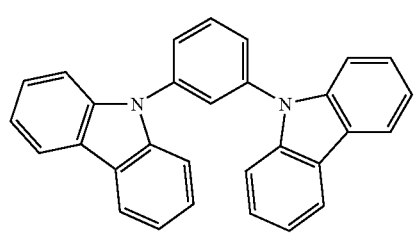
H-5
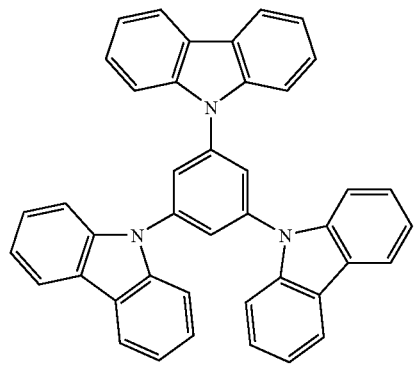
H-6
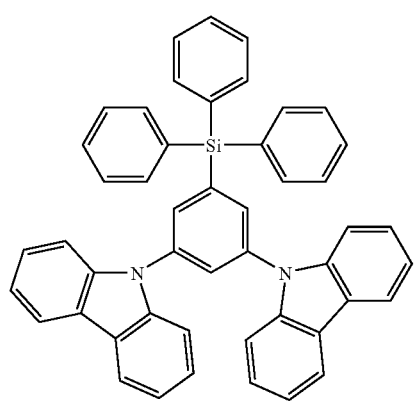
H-7
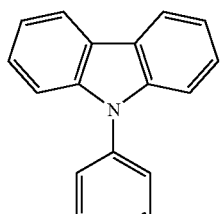
H-8
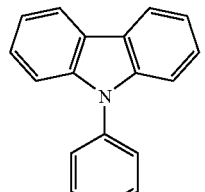
H-9
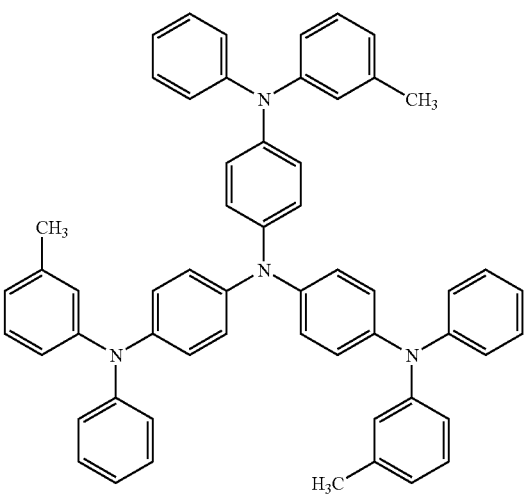

-continued
H-10
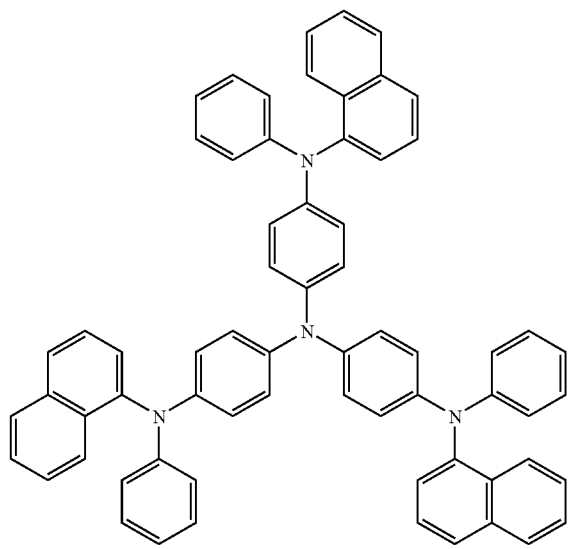
H-11
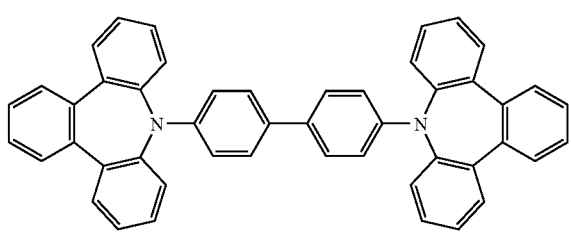
H-12
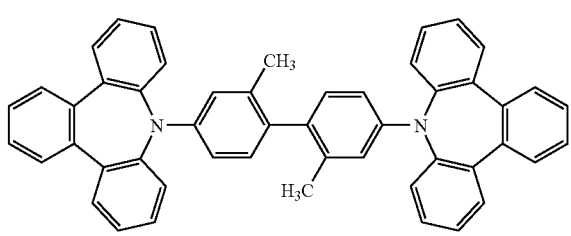
H-13
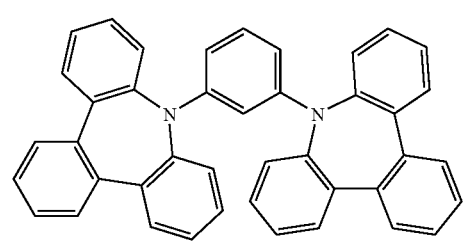
H-14
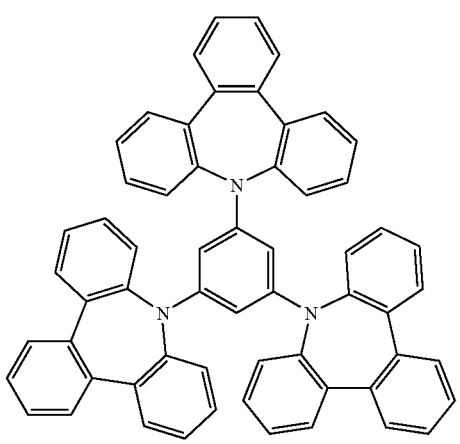
H-15
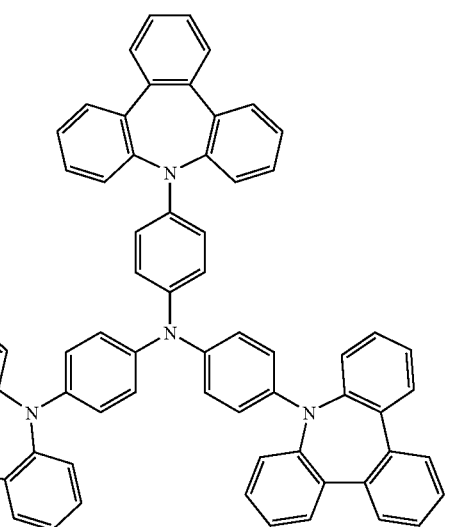
H-16
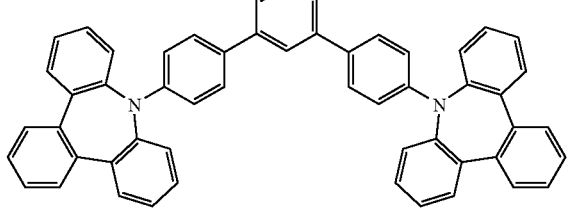

H-17
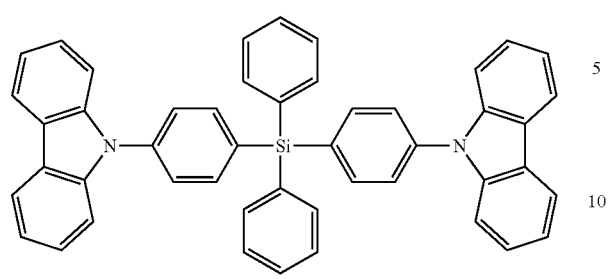
H-18
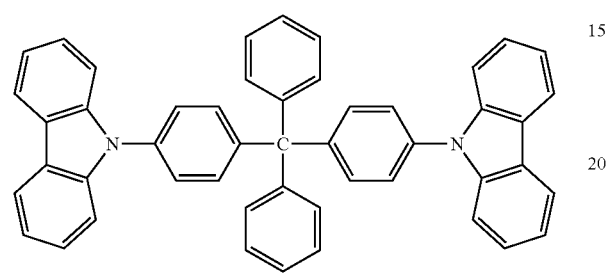
H-19
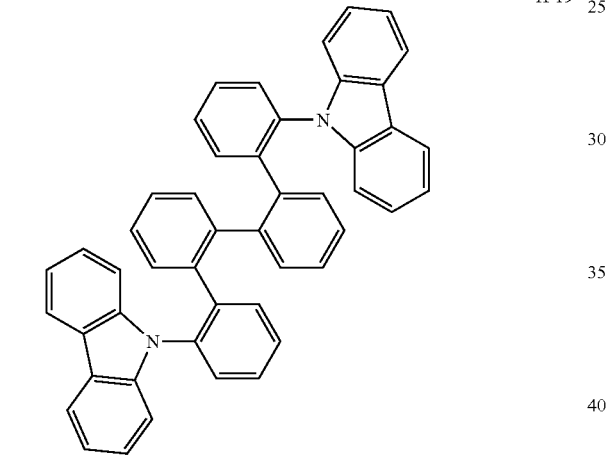
H-20
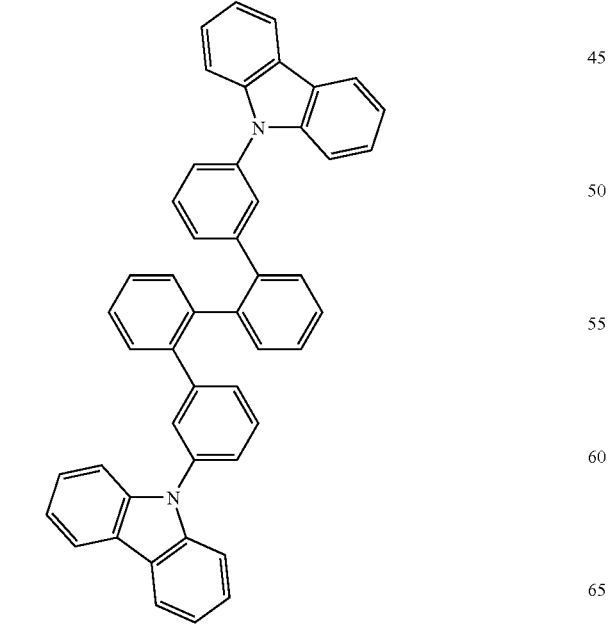
H-21
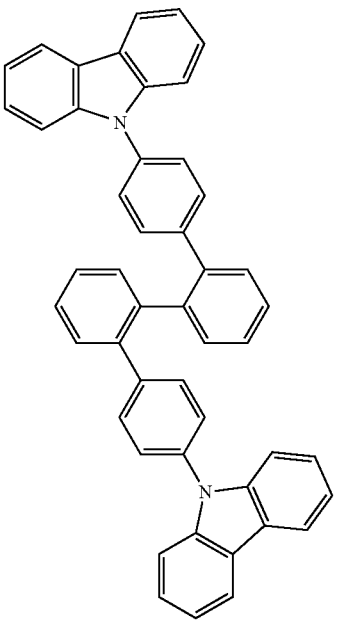
H-22
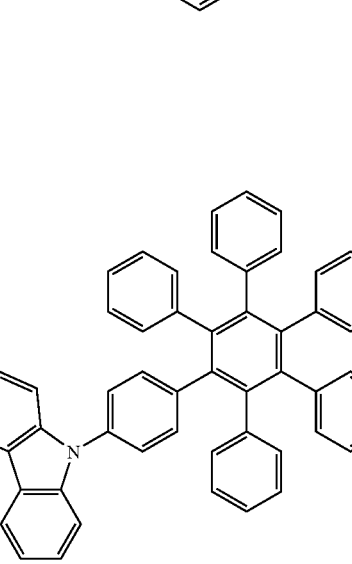
H-23
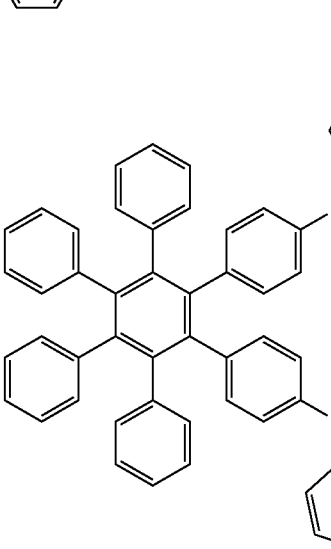

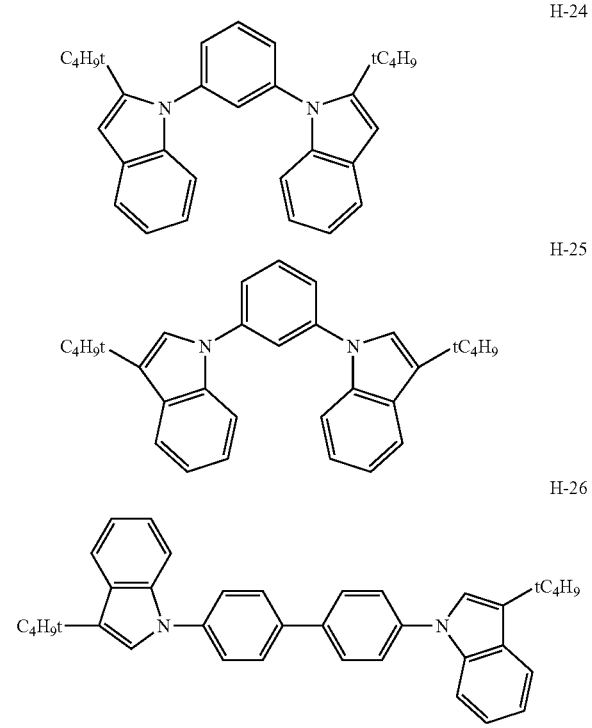

<<Electron Transporting Host>>

As the electron transporting host used according to the present invention, it is preferred that an electron affinity Ea of the host is 2.5 eV to 3.5 eV, more preferably 2.6 eV to 3.4 eV, and further preferably 2.8 eV to 3.3 eV in view of improvements in durability and decrease in driving voltage. Furthermore, it is preferred that an ionization potential Ip of the host is 5.7 eV to 7.5 eV, more preferably 5.8 eV to 7.0 eV, and further preferably 5.9 eV to 6.5 eV in view of improvements in durability and decrease in driving voltage.

Specific examples of such electron transporting hosts as mentioned above include pyridine, pyrimidine, triazine, imidazole, pyrazole, triazole, oxazole, oxadiazole, fluorenone, anthraquinonedimethane, anthrone, diphenylquinone, thiopyrandioxide, carbodiimide, fluorenylidenemethane, distyrylpyradine, fluorine-substituted aromatic compounds, heterocyclic tetracarboxylic anhydrides such as naphthaleneperylene and the like, phthalocyanine, derivatives thereof (which may form a condensed ring with another ring), and a variety of metal complexes represented by metal complexes of 8-quinolynol derivatives, metal phthalocyanine, and metal complexes having benzoxazole or benzothiazole as the ligand.

Preferable electron transporting hosts are metal complexes, azole derivatives (benzimidazole derivatives, imidazopyridine derivatives and the like), and azine derivatives (pyridine derivatives, pyrimidine derivatives, triazine derivatives and the like). Among these, metal complexes are preferred according to the present invention in view of durability. As the metal complex compound, a metal complex containing a ligand having at least one nitrogen atom, oxygen atom, or sulfur atom to be coordinated with the metal is more preferable.

Although a metal ion in the metal complex is not particularly limited, a beryllium ion, a magnesium ion, an aluminum ion, a gallium ion, a zinc ion, an indium ion, a tin ion, a platinum ion, or a palladium ion is preferred; more preferable is a beryllium ion, an aluminum ion, a gallium ion, a zinc ion, a platinum ion, or a palladium ion; and further preferable is an aluminum ion, a zinc ion, or a palladium ion.

Although there are a variety of well-known ligands to be contained in the above-described metal complexes, examples thereof include ligands described in "Photochemistry and Photophysics of Coordination Compounds" authored by H. Yersin, published by Springer-Verlag Company in 1987; "YUHKI KINZOKU KAGAKU—KISO TO OUYOU— (Metalorganic Chemistry—Fundamental and Application—)" authored by Akio Yamamoto, published by Shokabo Publishing Co., Ltd. in 1982; and the like.

The ligands are preferably nitrogen-containing heterocyclic ligands (having preferably 1 to 30 carbon atoms, more preferably 2 to 20 carbon atoms, and particularly preferably 3 to 15 carbon atoms), and they may be a unidentate ligand or a bi- or higher-dentate ligand. Preferable are bi- to hexa-dentate ligands, and mixed ligands of bi- to hexa-dentate ligands with a unidentate ligand are also preferable.

Examples of the ligands include azine ligands (e.g. pyridine ligands, bipyridyl ligands, terpyridine ligands and the like); hydroxyphenylazole ligands (e.g. hydroxyphenylbenzimidazole ligands, hydroxyphenylbenzoxazole ligands, hydroxyphenylimidazole ligands, hydroxyphenylimidazopyridine ligands and the like); alkoxy ligands (those having preferably 1 to 30 carbon atoms, more preferably 1 to 20 carbon atoms, and particularly preferably 1 to 10 carbon atoms, examples of which include methoxy, ethoxy, butoxy, 2-ethylhexyloxy and the like); aryloxy ligands (those having preferably 6 to 30 carbon atoms, more preferably 6 to 20 carbon atoms, and particularly preferably 6 to 12 carbon atoms, examples of which include phenyloxy, 1-naphthyloxy, 2-naphthyloxy, 2,4,6-trimethylphenyloxy, 4-biphenyloxy and the like); heteroaryloxy ligands (those having preferably 1 to 30 carbon atoms, more preferably 1 to 20 carbon atoms, and particularly preferably 1 to 12 carbon atoms, examples of which include pyridyloxy, pyrazyloxy, pyrimidyloxy, quinolyloxy and the like); alkylthio ligands (those having preferably 1 to 30 carbon atoms, more preferably 1 to 20 carbon atoms, and particularly preferably 1 to 12 carbon atoms, examples of which include methylthio, ethylthio and the like); arylthio ligands (those having preferably 6 to 30 carbon atoms, more preferably 6 to 20 carbon atoms, and particularly preferably 6 to 12 carbon atoms, examples of which include phenylthio and the like); heteroarylthio ligands (those having preferably 1 to 30 carbon atoms, more preferably 1 to 20 carbon atoms, and particularly preferably 1 to 12 carbon atoms, examples of which include pyridylthio, 2-benzimidazolylthio, 2-benzooxazolylthio, 2-benzothiazolylthio and the like); siloxy ligands (those having preferably 1 to 30 carbon atoms, more preferably 3 to 25 carbon atoms, and particularly preferably 6 to 20 carbon atoms, examples of which include a triphenylsiloxy group, a triethoxysiloxy group, a triisopropylsiloxy group and the like); aromatic hydrocarbon anion ligands (those having preferably 6 to 30 carbon atoms, more preferably 6 to 25 carbon atoms, and particularly preferably 6 to 20 carbon atoms, examples of which include a phenyl anion, a naphthyl anion, an anthranyl anion and the like anion); aromatic heterocyclic anion ligands (those having preferably 1 to 30 carbon atoms, more preferably 2 to 25 carbon atoms, and particularly preferably 2 to 20 carbon atoms, examples of which include a pyrrole anion, a pyrazole anion, a triazole anion, an oxazole anion, a benzoxazole anion, a thiazole anion, a benzothiazole anion, a thiophene anion, a benzothiophene anion and the like); indolenine anion ligands and the like. Among these, nitrogen-containing heterocyclic ligands, aryloxy ligands, heteroaryloxy groups, aromatic hydrocarbon anion ligands, aromatic heterocyclic anion ligands or siloxy ligands are preferable, and nitrogen-containing heterocyclic ligands, aryloxy ligands, siloxy ligands, aromatic hydrocarbon anion ligands, or aromatic heterocyclic anion ligands are more preferable.

Examples of the metal complex electron transporting hosts include compounds described, for example, in Japanese Patent Application Laid-Open Nos. 2002-235076, 2004-214179, 2004-221062, 2004-221065, 2004-221068, 2004-327313 and the like.

Specific examples of these electron transporting hosts include the following materials, but it should be noted that the present invention is not limited thereto.

E-1
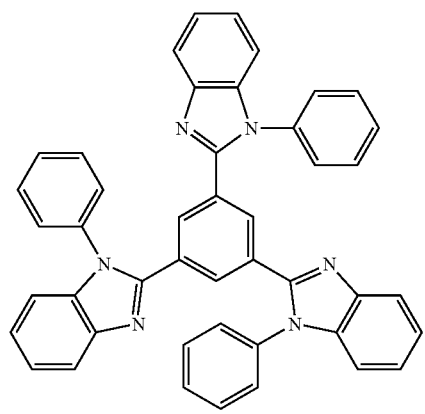

E-2
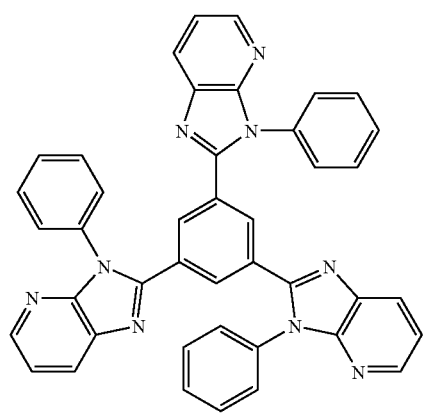

E-3
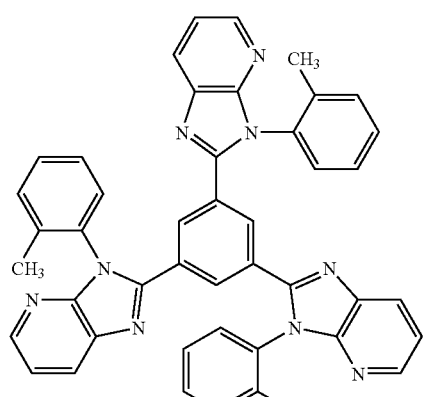

-continued

E-4
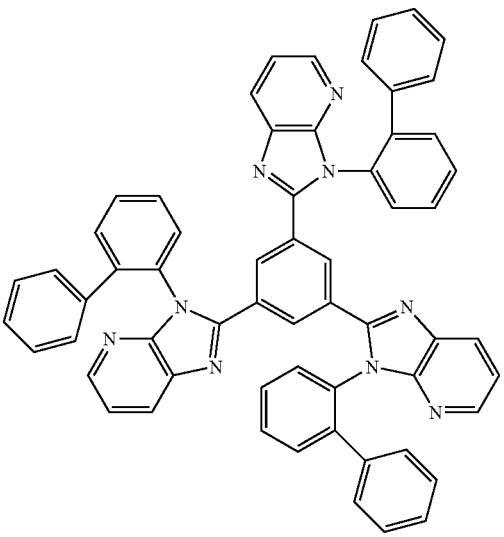

E-5
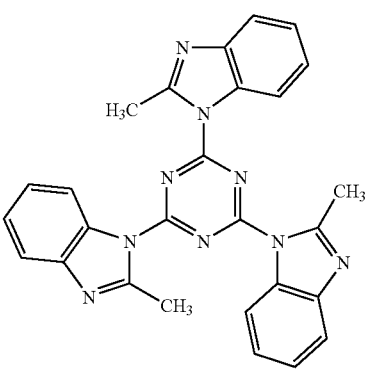

E-6
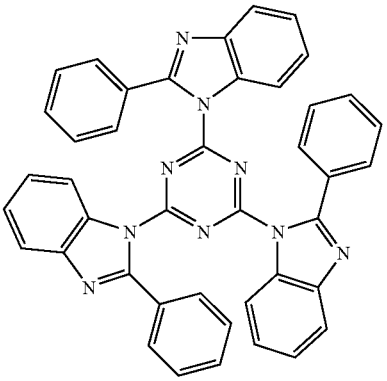

E-7
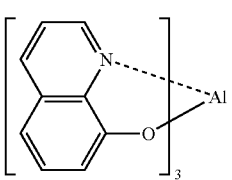

E-8
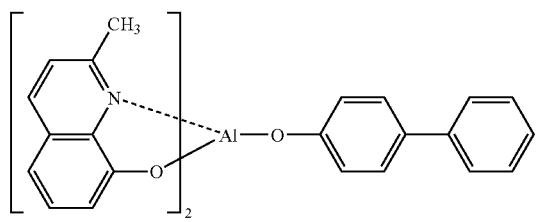
E-9
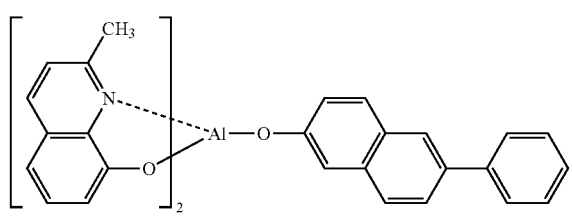
E-10
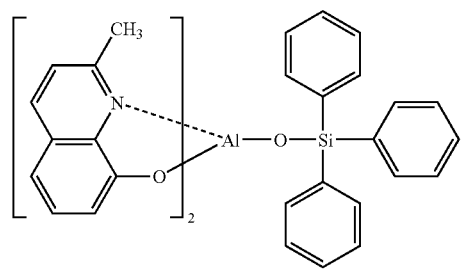
E-11
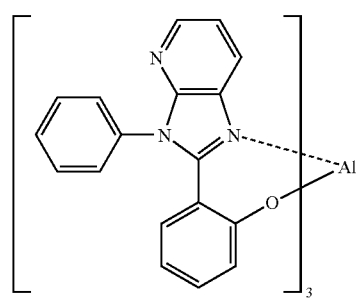
E-12
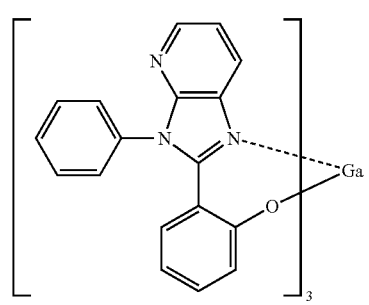
E-13
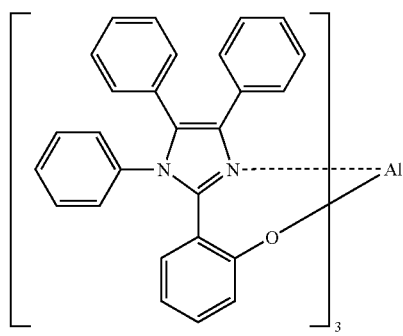
E-14
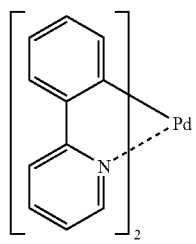
E-15
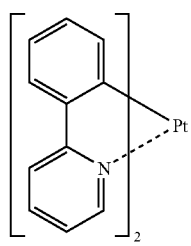
E-16
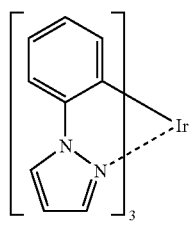
E-17
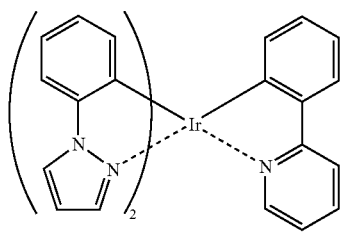
E-18
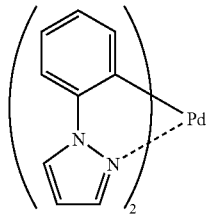

E-19 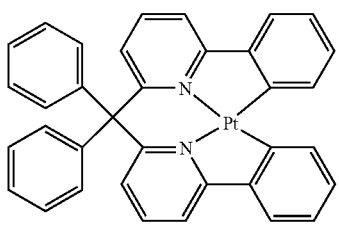

E-20 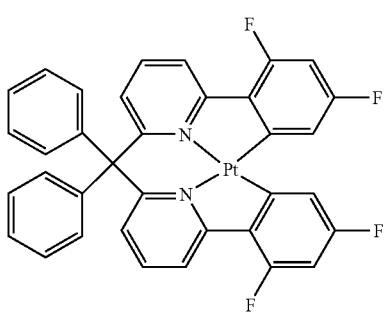

E-21 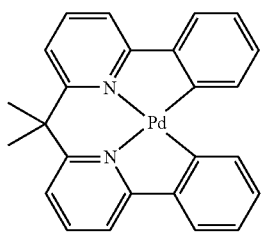

E-22 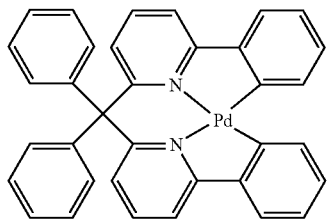

E-23 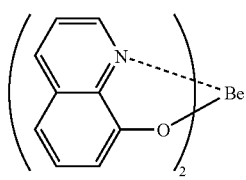

E-24 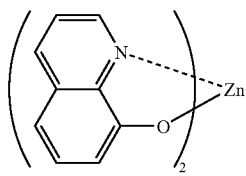

E-25 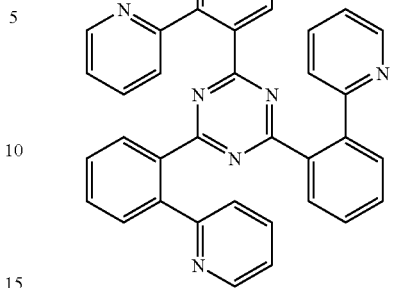

E-26 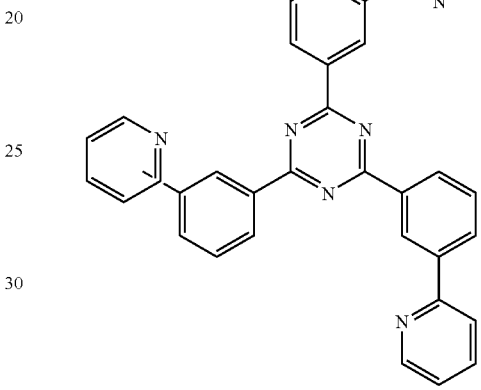

As the electron transportation hosts, E-1 to E-6, E-8, E-9, E-10, E-21, or E-22 is preferred, E-3, E-4, E-6, E-8, E-9, E-10, E-21, or E-22 is more preferred, and E-3, E-4, E-21, or E-22 is further preferred.

In the light-emitting layer of the present invention, it is preferred that when a phosphorescence luminescent dopant is used as the luminescent dopant, the lowest triplet excitation energy T1(D) in the phosphorescence luminescent dopant and the minimum value among the lowest triplet excitation energies T1(H) min in the plural host compounds satisfy the relationship of T1(H) min>T1(D) in view of color purity, external quantum efficiency, and driving durability.

Although a content of the host compounds according to the present invention is not particularly limited, it is preferably 15% by weight to 85% by weight with respect to the total volume of the compounds forming the light-emitting layer in view of external quantum efficiency and driving voltage.

(Hole Injection Layer and Hole Transport Layer)

The hole injection layer and hole transport layer correspond to layers functioning to receive holes from an anode or from an anode side and to transport the holes to a cathode side.

As a material for the hole injection layer and the hole transport layer, it is preferred to contain specifically pyrrole derivatives, carbazole derivatives, azacarbazole derivatives, indole derivatives, azaindole derivatives, pyrazole derivatives, imidazole derivatives, polyarylalkane derivatives, pyrazoline derivatives, pyrazolone derivatives, phenylenediamine derivatives, arylamine derivatives, amino-substituted calcon derivatives, styrylanthracene derivatives, fluorenone derivatives, hydrazone derivatives, stilbene derivatives, silazane derivatives, aromatic tertiary amine compounds, styrylamine compounds, aromatic dimethylidine compounds, porphyrin compounds, organosilane derivatives, carbon or the like.

The hole injection layer preferably contains a dopant which serves as a carrier to transport holes. As an electron-accepting dopant to be introduced into a hole injection layer or a hole transport layer, either of an inorganic compound or an organic compound may be used as long as the compound has electron accepting property and a function for oxidizing an organic compound. Specifically, inorganic compounds such as halides compounds, for example, ferric chloride, aluminum chloride, gallium chloride, indium chloride, antimony pentachloride and the like, and metal oxides such as vanadium pentaoxide, molybdenum trioxide and the like are preferably used as the inorganic compounds.

In case of the organic compounds, compounds having substituents such as a nitro group, a halogen, a cyano group, or a trifluoromethyl group; quinone compounds, acid anhydride compounds, and fullerenes may be preferably applied.

Specific examples of the organic compounds include hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, tetramethylbenzoquinone, 1,2,4,5-tetracyanobenzene, o-dicyanobenzene, p-dicyanobenzene, 1,4-dicyanotetrafluorobenzene, 2,3-dichloro-5,6-dicyanobenzoquinone, p-dinitrobenzene, m-dinitrobenzene, o-dinitrobenzene, p-cyanonitrobenzene, m-cyanonitrobenzene, o-cyanonitrobenzene, 1,4-naphthoquinone, 2,3-dichloronaphthoquinone, 1-nitronaphthalene, 2-nitronaphthalene, 1,3-dinitronaphthalene, 1,5-dinitronaphthalene, 9-cyanoanthoracene, 9-nitroanthracene, 9,10-anthraquinone, 1,3,6,8-tetranitrocarbazole, 2,4,7-trinitro-9-fluorenone, 2,3,5,6-tetracyanopyridine, maleic anhydride, phthalic anhydride, fullerene C60, and fullerene C70. Other specific examples include materials described in patent documents such as JP-A Nos. 6-212153, 11-111463, 11-251067, 2000-196140, 2000-286054, 2000-315580, 2001-102175, 2001-160493, 2002-252085, 2002-56985, 2003-157981, 2003-217862, 2003-229278, 2004-342614, 2005-72012, 2005-166637, 2005-209643 and the like.

Among these, hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthalene, 1,5-dinitronaphthalene, 9,10-anthraquinone, 1,3,6,8-tetranitrocarbazole, 2,4,7-trinitro-9-fluorenone, 2,3,5,6-tetracyanopyridine, or fullerene C60 is preferable. Hexacyanobutadiene, hexacyanobenzene, tetracyanoethylene, tetracyanoquinodimethane, tetrafluorotetracyanoquinodimethane, p-fluoranil, p-chloranil, p-bromanil, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoquinone, or 2,3,5,6-tetracyanopyridine is particularly preferred, and tetrafluorotetracyanoquinodimethane is most particularly preferred.

These electron-accepting dopants may be used alone or in a combination of two or more of them.

Although an applied amount of these electron-accepting dopants depends on the type of material, 0.01% by weight to 50% by weight of a dopant is preferred with respect to a hole transport layer material, 0.05% by weight to 20% by weight is more preferable, and 0.1% by weight to 10% by weight is particularly preferred. When the amount applied is less than 0.01% by weight with respect to the hole transportation material, it is not desirable because the advantageous effects of the present invention are insufficient, and when it exceeds 50% by weight, hole transportation ability is deteriorated, and thus, this is not preferred.

In a case where the hole injection layer contains an acceptor, it is preferred that the hole transport layer has no substantial acceptor.

Although a thickness of the hole injection layer and the hole transport layer is not particularly limited, it is preferred that the thickness is 1 nm to 5 μm, it is more preferably 5 nm to 1 μm, and 10 nm to 500 nm is particularly preferred in view of decrease in driving voltage, improvements in external quantum efficiency, and improvements in durability.

The hole injection layer and the hole transport layer may be composed of a mono-layered structure comprising one or two or more of the above-mentioned materials, or a multilayer structure composed of plural layers of a homogeneous composition or a heterogeneous composition.

When the carrier transportation layer adjacent to the light emitting layer is a hole transport layer, it is preferred that the Ip (HTL) of the hole transport layer is smaller than the Ip (D) of the dopant contained in the light emitting layer in view of driving durability.

The Ip value in the present invention is determined by measuring with a UV PHOTO-ELECTRON ANALYZER AC-1 (manufactured by Riken Keiki Co., Ltd.) under room temperature in atmosphere. A fundamental principle of a measurement by the AC-1 is described, for example, in "DATA BOOK OF WORK FUNCTION ABOUT ORGANIC THIN FILMS" authored by CHIHAYA ADACHI et al., published by CMC Publishing Co., Ltd, in 2004.

(Electron Injection Layer and Electron Transport Layer)

The electron injection layer and the electron transport layer are layers having any of functions for injecting electrons from the cathode, transporting electrons, and becoming a barrier to holes which could be injected from the anode.

Specific examples of the materials applied for the electron injection layer and the electron transport layer include pyridine, pyrimidine, triazine, imidazole, triazole, oxazole, oxadiazole, fluorenone, anthraquinodimethane, anthrone, diphenylquinone, thiopyrandioxide, carbodiimide, fluorenylidenemethane, distyrylpyradine, fluorine-substituted aromatic compounds, naphthalene, heterocyclic tetracarboxylic anhydrides such as perylene, phthalocyanine, and the derivatives thereof (which may form condensed rings with the other rings); and metal complexes represented by metal complexes of 8-quinolinol derivatives, metal phthalocyanine, and metal complexes containing benzoxazole, or benzothiazole as the ligand.

As a material applied for the electron-donating dopant with respect to the electron injection layer or the electron transport layer, any material may be used as long as it has an electron-donating property and a property for reducing an organic compound, and alkaline metals such as Li, alkaline earth metals such as Mg, and transition metals including rare-earth metals are preferably used.

Particularly, metals having a work function of 4.2 eV or less are preferably applied, and specific examples thereof include Li, Na, K, Be, Mg, Ca, Sr, Ba, Y, Cs, La, Sm, Gd, and Yb.

These electron-donating dopants may be used alone or in a combination of two or more of them.

An applied amount of the electron-donating dopants differs dependent on the types of the materials, but it is preferably 0.1% by weight to 99% by weight with respect to an electron transport layer material, more preferably 1.0% by weight to 80% by weight, and particularly preferably 2.0% by weight to 70% by weight. When the amount applied is less than 0.1% by weight with respect to the electron transport layer material, the effects of the present invention are insufficient so that it is not desirable, and when it exceeds 99% by weight, the electron transportation ability is deteriorated so that it is not preferred.

Although a thickness of the electron injection layer and the electron transport layer is not particularly limited, it is preferred that the thickness is 1 nm to 5 µm, it is more preferably 5 nm to 1 µm, and it is particularly preferably 10 nm to 500 nm in view of decrease in driving voltage, improvements in external quantum efficiency, and improvements in durability.

The electron injection layer and the electron transport layer may have either a mono-layered structure comprising one or two or more of the above-mentioned materials, or a multilayer structure composed of plural layers of a homogeneous composition or a heterogeneous composition.

When the carrier transportation layer adjacent to the light emitting layer is an electron transport layer, it is preferred that the Ea (ETL) of the electron transport layer is higher than the Ea (D) of the dopants contained in the light emitting layer in view of driving durability.

The Ea value in the present invention is determined by the following equation, where Eg is a band gap derived from a longer wavelength edge in a measured absorption spectrum of a single layer of the material, and Ip is an ionization potential obtained by another measurement.

$$Ea = Ip - Eg$$

(Hole Blocking Layer)

A hole blocking layer is a layer having a function to prevent the holes transported from the anode to the light emitting layer from passing through to the cathode side. According to the present invention, a hole blocking layer may be provided as an organic compound layer adjacent to the light emitting layer on the cathode side.

The hole blocking layer is not particularly limited, but specifically, it may contain an aluminum complex such as BAlq, a triazole derivative, a pyrazabol derivative or the like.

It is preferred that a thickness of the hole blocking layer is generally 50 nm or less in order to lower the driving voltage, more preferably it is 1 nm to 50 nm, and further preferably it is 5 nm to 40 nm.

(Anode)

The anode may generally be any material as long as it has a function as an electrode for supplying holes to the organic compound layer, and there is no particular limitation as to the shape, the structure, the size or the like. However, it may be suitably selected from among well-known electrode materials according to the application and purpose of the luminescent device. As mentioned above, the anode is usually provided as a transparent anode.

Materials for the anode may preferably include, for example, metals, alloys, metal oxides, electric conductive compounds, and mixtures thereof, and those having a work function of 4.0 eV or more are preferred. Specific examples of the anode materials include electric conductive metal oxides such as tin oxides doped with antimony, fluorine or the like (ATO and FTO), tin oxide, zinc oxide, indium oxide, indium tin oxide (ITO), and indium zinc oxide (IZO); metals such as gold, silver, chromium, and nickel; mixtures or laminates of these metals and the electric conductive metal oxides; inorganic electric conductive materials such as copper iodide and copper sulfide; organic electric conductive materials such as polyaniline, polythiophene, and polypyrrole; and laminates of these inorganic or organic electron-conductive materials with ITO. Among these, the electric conductive metal oxides are preferred, and particularly, ITO is preferable in view of productivity, high electric conductivity, transparency and the like.

The anode may be formed on the substrate in accordance with a method which is appropriately selected from among wet methods such as printing methods, coating methods and the like; physical methods such as vacuum deposition methods, sputtering methods, ion plating methods and the like; and chemical methods such as CVD and plasma CVD methods and the like, in consideration of the suitability to a material constituting the anode. For instance, when ITO is selected as a material for the anode, the anode may be formed in accordance with a DC or high-frequency sputtering method, a vacuum deposition method, an ion plating method or the like.

In the organic electroluminescence element of the present invention, a position at which the anode is to be formed is not particularly limited, but it may be suitably selected according to the application and purpose of the luminescent device. The anode may be formed on either the whole surface or a part of the surface on either side of the substrate.

For patterning to form the anode, a chemical etching method such as photolithography, a physical etching method such as etching by laser, a method of vacuum deposition or sputtering through superposing masks, or a lift-off method or a printing method may be applied.

A thickness of the anode may be suitably selected according to the material constituting the anode and is therefore not definitely decided, but it is usually in the range of around 10 nm to 50 µm, and preferably 50 nm to 20 µm.

A value of resistance of the anode is preferably $10^3 \Omega/\square$ or less, and $10^2 \Omega/\square$ or less is more preferable. In the case where the anode is transparent, it may be either transparent and colorless, or transparent and colored. For extracting luminescence from the transparent anode side, it is preferred that a light transmittance of the anode is 60% or higher, and more preferably 70% or higher.

Concerning transparent anodes, there is a detailed description in "TOUMEI DENNKYOKU-MAKU NO SHINTENKAI (Novel Developments in Transparent Electrode Films)" edited by Yutaka Sawada, published by C.M.C. in 1999, the contents of which are incorporated by reference herein. In the case where a plastic substrate having a low heat resistance is applied, it is preferred that ITO or IZO is used to obtain a transparent anode prepared by forming the film at a low temperature of 150° C. or lower.

(Cathode)

The cathode may generally be any material as long as it has a function as an electrode for injecting electrons to the organic compound layer, and there is no particular limitation as to the shape, the structure, the size or the like. However it may be suitably selected from among well-known electrode materials according to the application and purpose of the luminescent device.

Materials constituting the cathode may include, for example, metals, alloys, metal oxides, electric conductive compounds, and mixtures thereof, and materials having a work function of 4.5 eV or less are preferred. Specific examples thereof include alkali metals (e.g., Li, Na, K, Cs or the like), alkaline earth metals (e.g., Mg, Ca or the like), gold, silver, lead, aluminum, sodium-potassium alloys, lithium-aluminum alloys, magnesium-silver alloys, rare earth metals such as indium, and ytterbium, and the like. They may be used alone, but it is preferred that two or more of them are used in combination from the viewpoint of satisfying both stability and electron injectability.

Among these, as the materials for constituting the cathode, alkaline metals or alkaline earth metals are preferred in view of electron injectability, and materials containing aluminum as a major component are preferred in view of excellent preservation stability.

The term "material containing aluminum as a major component" refers to a material constituted by aluminum alone; alloys comprising aluminum and 0.01% by weight to 10% by weight of an alkaline metal or an alkaline earth metal; or the mixtures thereof (e.g., lithium-aluminum alloys, magnesium-aluminum alloys and the like).

Regarding materials for the cathode, they are described in detail in JP-A Nos. 2-15595 and 5-121172, of which are incorporated by reference herein.

A method for forming the cathode is not particularly limited, but it may be formed in accordance with a well-known method.

For instance, the cathode may be formed in accordance with a method which is appropriately selected from among wet methods such as printing methods, coating methods and the like; physical methods such as vacuum deposition methods, sputtering methods, ion plating methods and the like; and chemical methods such as CVD and plasma CVD methods and the like, in consideration of the suitability to a material constituting the cathode. For example, when a metal (or metals) is (are) selected as a material (or materials) for the cathode, one or two or more of them may be applied at the same time or sequentially in accordance with a sputtering method or the like.

For patterning to form the cathode, a chemical etching method such as photolithography, a physical etching method such as etching by laser, a method of vacuum deposition or sputtering through superposing masks, or a lift-off method or a printing method may be applied.

In the present invention, a position at which the cathode is to be formed is not particularly limited, and it may be formed on either the whole or a part of the organic compound layer.

Furthermore, a dielectric material layer made of fluorides, oxides or the like of an alkaline metal or an alkaline earth metal may be inserted in between the cathode and the organic compound layer with a thickness of 0.1 nm to 5 nm. The dielectric layer may be considered to be a kind of electron injection layer. The dielectric material layer may be formed in accordance with, for example, a vacuum deposition method, a sputtering method, an ion-plating method or the like.

A thickness of the cathode may be suitably selected according to materials for constituting the cathode and is therefore not definitely decided, but it is usually in the range of around 10 nm to 5 μm, and preferably 50 nm to 1 μm.

Moreover, the cathode may be transparent or opaque. The transparent cathode may be formed by preparing a material for the cathode with a small thickness of 1 nm to 10 nm, and further laminating a transparent electric conductive material such as ITO or IZO thereon.

(Substrate)

According to the present invention, a substrate may be applied. The substrate to be applied is preferably one which does not scatter or attenuate light emitted from the organic compound layer. Specific examples of materials for the substrate include zirconia-stabilized yttrium (YSZ); inorganic materials such as glass; polyesters such as polyethylene terephthalate, polybutylene phthalate, and polyethylene naphthalate; and organic materials such as polystyrene, polycarbonate, polyethersulfon, polyarylate, polyimide, polycycloolefin, norbornene resin, poly(chlorotrifluoroethylene), and the like.

For instance, when glass is used as the substrate, non-alkali glass is preferably used with respect to the quality of material in order to decrease ions eluted from the glass. In the case of employing soda-lime glass, it is preferred to use glass on which a barrier coat such as silica has been applied. In the case of employing an organic material, it is preferred to use a material excellent in heat resistance, dimensional stability, solvent resistance, electrical insulation, and workability.

There is no particular limitation as to the shape, the structure, the size or the like of the substrate, but it may be suitably selected according to the application, purposes and the like of the luminescent device. In general, a plate-like substrate is preferred as the shape of the substrate. A structure of the substrate may be a monolayer structure or a laminated structure. Furthermore, the substrate may be formed from a single member or two or more members.

Although the substrate may be in a transparent and colorless, or a transparent and colored condition, it is preferred that the substrate is transparent and colorless from the viewpoint that the substrate does not scatter or attenuate light emitted from the organic light emitting layer.

A moisture permeation preventive layer (gas barrier layer) may be provided on the front surface or the back surface of the substrate.

For a material of the moisture permeation preventive layer (gas barrier layer), inorganic substances such as silicon nitride and silicon oxide may be preferably applied. The moisture permeation preventive layer (gas barrier layer) may be formed in accordance with, for example, a high-frequency sputtering method or the like.

In the case of applying a thermoplastic substrate, a hard-coat layer or an under-coat layer may be further provided as needed.

(Protective Layer)

According to the present invention, the whole organic EL device may be protected by a protective layer.

A material contained in the protective layer may be one having a function to prevent penetration of substances such as moisture and oxygen, which accelerate deterioration of the device, into the device.

Specific examples thereof include metals such as In, Sn, Pb, Au, Cu, Ag, Al, Ti, Ni and the like; metal oxides such as MgO, SiO, $SiO_2$, $Al_2O_3$, GeO, NiO, CaO, BaO, $Fe_2O_3$, $Y_2O_3$, $TiO_2$ and the like; metal nitrides such as $SiN_x$, $SiN_xO_y$, and the like; metal fluorides such as $MgF_2$, LiF, $AlF_3$, $CaF_2$ and the like; polyethylene; polypropylene; polymethyl methacrylate; polyimide; polyurea; polytetrafluoroethylene; polychlorotrifluoroethylene; polydichlorodifluoroethylene; a copolymer of chlorotrifluoroethylene and dichlorodifluoroethylene; copolymers obtained by copolymerizing a monomer mixture containing tetrafluoroethylene and at least one co-monomer; fluorine-containing copolymers each having a cyclic structure in the copolymerization main chain; water-absorbing materials each having a coefficient of water absorption of 1% or more; moisture permeation preventive substances each having a coefficient of water absorption of 0.1% or less; and the like.

There is no particular limitation as to a method for forming the protective layer. For instance, a vacuum deposition method, a sputtering method, a reactive sputtering method, an MBE (molecular beam epitaxial) method, a cluster ion beam method, an ion plating method, a plasma polymerization method (high-frequency excitation ion plating method), a plasma CVD method, a laser CVD method, a thermal CVD method, a gas source CVD method, a coating method, a printing method, or a transfer method may be applied.

(Sealing)

The whole organic electroluminescence element of the present invention may be sealed with a sealing cap.

Furthermore, a moisture absorbent or an inert liquid may be used to seal a space defined between the sealing cap and the luminescent device. Although the moisture absorbent is not particularly limited, specific examples thereof include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, a molecular sieve, zeolite, magnesium oxide and the like. Although the inert liquid is not particularly limited, specific examples thereof include paraffins; liquid paraffins; fluorine-based solvents such as perfluoroalkanes, perfluoroamines, perfluoroethers and the like; chlorine-based solvents; silicone oils; and the like.

3. Driving

In the organic electroluminescence element of the present invention, when a DC (AC components may be contained as needed) voltage (usually 2 volts to 15 volts) or DC is applied across the anode and the cathode, luminescence can be obtained.

The driving durability of the organic electroluminescence element according to the present invention can be determined based on the time required for reduction to a certain brightness at a specified brightness. For instance, the brightness reduction time may be determined by using a source measure unit, model 2400, manufactured by KEITHLEY Instruments Inc. to apply a DC voltage to the organic EL device to cause it to emit light, conducting a continuous driving test under the condition that the initial brightness is 1000 cd/m$^2$, defining the time required for the brightness to reach 80% of the initial brightness as the brightness reduction time, and then comparing the resulting brightness reduction time with that of a conventional luminescent device. According to the present invention, the numerical value thus obtained was used.

An important characteristic parameter of the organic electroluminescence element of the present invention is external quantum efficiency. The external quantum efficiency is calculated by "the external quantum efficiency ($\phi$)=the number of photons emitted from the device/the number of electrons injected to the device", and it may be said that the larger the value obtained is, the more advantageous the device is in view of electric power consumption.

Moreover, the external quantum efficiency of the organic electroluminescence element is decided by "the external quantum efficiency ($\phi$)=the internal quantum efficiency×light-extraction efficiency". In an organic EL device which utilizes fluorescent luminescence from an organic compound, an upper limit of the internal quantum efficiency is 25%, while the light-extraction efficiency is about 20%, and accordingly, it is considered that an upper limit of the external quantum efficiency is about 5%.

As the numerical value of the external quantum efficiency, the maximum value thereof when the device is driven at 20° C., or a value of the external quantum efficiency at about 100 cd/m$^2$ to 2000 cd/m$^2$ According to the present invention, a value obtained by the following method is used. Namely, a DC constant voltage is applied to the EL device by the use of a source measure unit, model 2400, manufactured by KEITHLEY Instruments Inc. to cause it to emit light, the brightness of the light is measured by using a brightness photometer (trade name: SR-3, manufactured by Topcon Corporation), and then, the external quantum efficiency at the luminescent brightness is calculated.

Further, an external quantum efficiency of the luminescent device may be obtained by measuring the luminescent brightness, the luminescent spectrum, and the current density, and calculating the external quantum efficiency from these results and a specific visibility curve. In other words, using the current density value, the number of electrons injected can be calculated. By an integration calculation using the luminescent spectrum and the specific visibility curve (spectrum), the luminescent brightness can be converted into the number of photons emitted. From the result, the external quantum efficiency (%) can be calculated by "(the number of photons emitted/the number of electrons injected to the device)×100".

For the driving method of the organic electroluminescence element of the present invention, driving methods described in JP-A Nos. 2-148687, 6-301355, 5-29080, 7-134558, 8-234685, and 8-241047; Japanese Patent No. 2784615, U.S. Pat. Nos. 5,828,429 and 6,023,308 are applicable.

4. Application

The application of the organic electroluminescence element in the present invention is not particularly restricted, but it can be appropriately used in broad fields including displays for portable phones, personal digital assistants (PDA), computer displays, information displays for vehicles, TV monitors, or conventional illumination light sources and the like.

EXAMPLES

In the following, examples of the organic electroluminescence element of the present invention will be described, but it should be noted that the present invention is not limited to these examples.

Example 1

1. Preparation of Organic EL Element (Preparation of Comparative Organic EL Element No. A)

A 2.5 cm square ITO glass substrate having a 0.5 mm thickness (manufactured by Geomatec Co., Ltd.; surface resistance: 10Ω/□) was placed in a washing container to apply ultrasonic cleaning in 2-propanol, and then, UV-ozone treatment was applied for 30 minutes. On this transparent anode, the following layers were deposited in accordance with a vacuum deposition method. In the examples of the present invention, a deposition rate was 0.2 nm/second, unless otherwise specified, wherein the deposition rate was measured by the use of a quartz oscillator. The thicknesses of layers described below were also measured by using the quartz oscillator.

—Hole Injection Layer—

On the ITO layer, CuPc was deposited by the evaporation method at a thickness of 10 nm.

—Hole Transport Layer—

On the hole injection layer, α-NPD was deposited by the evaporation method at a thickness of 30 nm.

—Light Emitting Layer—

CBP and Ir(ppy)$_3$ were co-deposited at a volume ratio of 95:5. The thickness of the light emitting layer was 140 nm.

—Electron Transport Layer—

BAlq was deposited on the light emitting layer by the evaporation method at a thickness of 10 nm.

—Electron Injection Layer—

Alq was deposited on the electron transport layer by the evaporation method at a thickness of 20 nm.

On the resulting layers, a patterned mask (mask by which the light emitting region becomes 2 mm×2 mm) was disposed, and lithium fluoride was deposited at a thickness of 1 nm at a deposition rate of 0.01 nm/second to obtain an electron injection layer. Further, metal aluminum was deposited thereon with a 100 nm thickness to obtain a cathode.

The prepared lamination body was placed in a globe box whose contents were replaced by nitrogen gas, and it was sealed by the use of a sealing cap made of stainless steel and a UV curable adhesive (trade name: XNR5516HV, manufactured by Nagase-Ciba Co., Ltd.).

Thus, the comparative organic EL element No. A was obtained.

(Preparation of Comparative Organic EL Element No. B)

In the process of preparing the comparative organic EL device No. A, the light emitting layer was divided into three unit light emitting layers as shown below, and the following intermediate layers 1 and 2 were disposed as the following electric charge blocking layers between the respective unit light emitting layers. In order from the hole transport layer, unit light emitting layer 1/intermediate layer 2/unit light emitting layer 2/intermediate layer 1/unit light emitting layer 3 were provided.

Light emitting layer 1: a light emitting layer of a composition identical with that of comparative element No. A was vapor deposited to a thickness of 30 nm.

Intermediate layer 2: mCP was vapor deposited at a thickness of 25 nm.

Light emitting layer 2: a light emitting layer of a composition identical with that of comparative element No. A was vapor deposited to a thickness of 30 nm.

Intermediate layer 1: mCP was vapor deposited at the thickness of the 25 nm.

Light emitting layer 3: a light emitting layer of a composition identical with that of comparative element No. A was vapor deposited to a thickness of 30 nm.

(Preparation of Organic EL Element No. 1 of the Invention)

An organic EL element No. 1 of the invention was manufactured in the same manner as the comparative organic EL element No. B except for changing the electron blocking material in the intermediate layers 1 and 2 to the materials shown in the following Table 1.

bility in organic EL element No. 1 according to the present invention were further improved. It was a quite unexpected result that both of high external quantum efficiency and driving durability were exhibited in the organic EL element of the present invention even though the total thickness for the two intermediate layers and the three unit light emitting layers was equal with the 140 nm thickness for the comparative organic EL elements.

TABLE 2

| Element No. | Performance | | |
|---|---|---|---|
| | External Quantum Efficiency (%) | Brightness Reduction Time (hours) | Luminance (cd/m$^2$) |
| Comparative Element A (Single Layer Element) | 6.75 | 65 | 1000 |
| Comparative Element B (Divided Plural Layers) | 7.90 | 78 | 1000 |
| Inventive Element 2 (Divided Plural Layers) | 9.43 | 113 | 1000 |

Example 2

1. Preparation of Organic EL Element (Preparation of Comparative Organic EL Element No. C)

A comparative organic EL element No. C was manufactured in the same manner as the comparative organic EL element No. A except for changing the light emitting layer to the following composition.

Light emitting layer: mCP and Ir(ppy)$_3$ were co-deposited at a volume ratio of 95:5. The thickness of the light emitting layer was 140 nm.

(Preparation of Comparative Organic EL Element No. D)

In the process of preparing the comparative organic EL device No. C, the light emitting layer was divided into the following four unit light emitting layers, and the following intermediate layers 11 to 13 were disposed between the respective unit light emitting layers. In order from the hole transport layer, the respective unit light emitting layer 11/in-

TABLE 1

| Element No. | Light Emitting Layer | | Intermediate Layer 2 | | Intermediate Layer 1 | | ΔEa | |
|---|---|---|---|---|---|---|---|---|
| | | | Electron Blocking | | Electron Blocking | | | |
| | Material | Ea | Material | Ea | Material | Ea | ΔEa$_2$ | ΔEa$_1$ |
| Comparative Element A (Single Layer Element) | CBP | 2.7 eV | — | — | — | — | — | — |
| Comparative Element B (Divided Plural Layers) | CBP | 2.7 eV | mCP | 2.5 eV | mCP | 2.5 eV | 0.2 eV | 0.2 eV |
| Inventive Element 1 (Divided Plural Layers) | CBP | 2.7 eV | Compound A | 2.4 eV | Compound B | 2.6 eV | 0.3 eV | 0.1 eV |

2. Result of Performance Evaluation

For the obtained comparative organic EL elements and the inventive organic EL element, the external quantum efficiency and the driving durability (brightness reduction time) were measured under the same conditions by the means as described above. The results obtained are shown in Table 2.

As a result, while the external quantum efficiency and the driving durability were improved in comparative organic EL element No. B compared to comparative organic EL element No. A, the external quantum efficiency and the driving duratermediate layer 13/unit light emitting layer 12/intermediate layer 12/unit light emitting layer 13/intermediate layer 11/unit light emitting layer 14 were provided.

Unit light emitting layers 11-14: vapor deposited with a composition identical with the light emitting layer of comparative organic EL element No. C to a thickness of 20 nm for each layer.

Intermediate layers 11-13: compound C was vapor deposited at a thickness of 20 nm.

That is, the light emitting layer has a constitution finely divided into 7 layers in total for unit organic electroluminescence element 11/intermediate layer 13/unit light emitting layer 12/intermediate layer 12/unit light emitting layer 13/intermediate layer 11/unit light emitting layer 14, having a total thickness of 140 nm, which is identical with the thickness of the light emitting layer of the comparative organic EL element No. C.

(Preparation of Organic EL Element No. 2 of the Invention)

An organic EL element No. 2 of the invention was manufactured in the same manner as the comparative organic EL element No. D except for changing the hole blocking material in the intermediate layers 11, 12 and 13 to the materials shown in the following Table 3.

2. Result of Performance Evaluation

For the obtained comparative organic EL elements and the organic EL device No. 2 of the invention, the external quantum efficiency and the driving durability (brightness reduction time) were measured in the same manner as in Example 1. The results obtained are shown in Table 4.

As a result, while the external quantum efficiency and the brightness reduction time were improved in comparative organic EL element No. D compared to comparative organic EL element No. C, the external quantum efficiency and the brightness reduction time in organic EL element No. 2 according to the present invention were further improved.

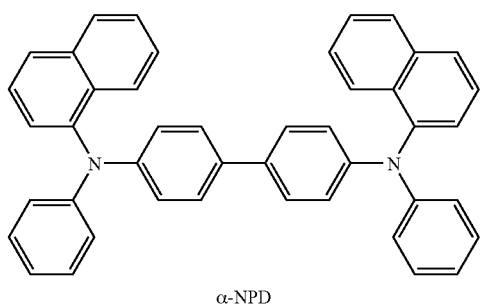

α-NPD

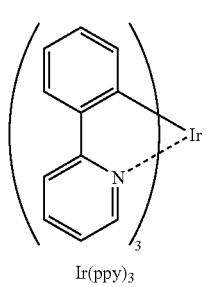

Ir(ppy)$_3$

TABLE 3

| Element No. | Light Emitting Layer Material | Ip | Intermediate Layer 13 Hole Blocking Material | Ip | Intermediate Layer 12 Hole Blocking Material | Ip | Intermediate Layer 11 Hole Blocking Material | Ip | ΔIp$_3$ | ΔIp$_2$ | ΔIp$_1$ |
|---|---|---|---|---|---|---|---|---|---|---|---|
| Comparative Element C (Single Layer Element) | mCP | 6.0 eV | — | — | — | — | — | — | — | — | — |
| Comparative Element D (Divided Plural Layers) | mCP | 6.0 eV | Compound C | 6.4 eV | Compound C | 6.4 eV | Compound C | 6.4 eV | 0.4 eV | 0.4 eV | 0.4 eV |
| Inventive Element 2 (Divided Plural Layers) | mCP | 6.0 eV | Compound B | 6.1 eV | Compound C | 6.4 eV | Compound D | 6.6 eV | 0.1 eV | 0.2 eV | 0.6 eV |

TABLE 4

| | Performance | | |
|---|---|---|---|
| Element No. | External Quantum Efficiency (%) | Brightness Reduction Time (hours) | Luminance (cd/m$^2$) |
| Comparative Element C (Single Layer Element) | 7.10 | 55 | 1000 |
| Comparative Element D (Divided Plural Layers) | 8.32 | 69 | 1000 |
| Inventive Element 2 (Divided Plural Layers) | 10.5 | 102 | 1000 |

Structures of the compounds used in the above-described light emitting elements are shown below.

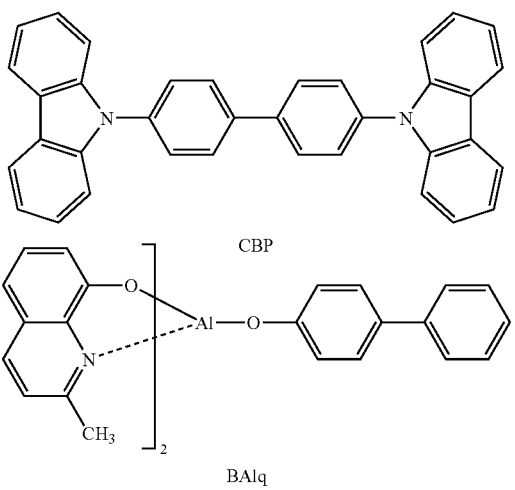

CBP

BAlq

-continued

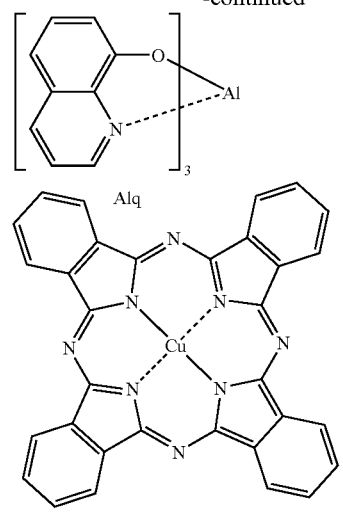

Alq

CuPC

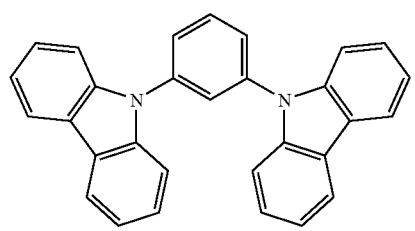

mCP

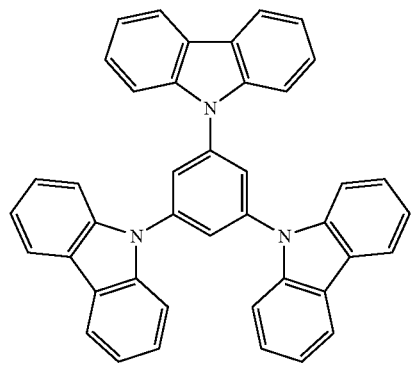

Compound A

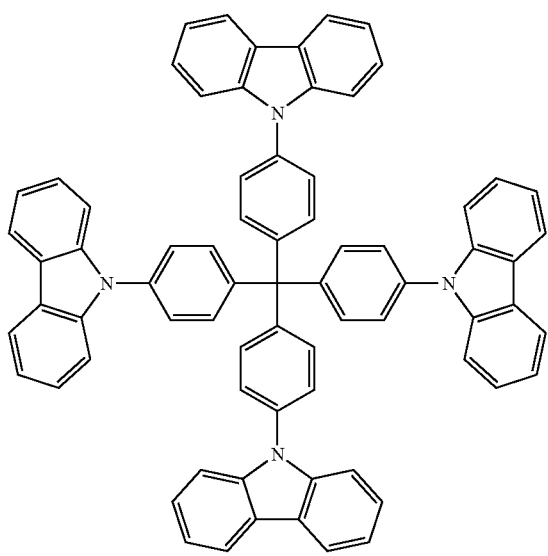

Compound B

-continued

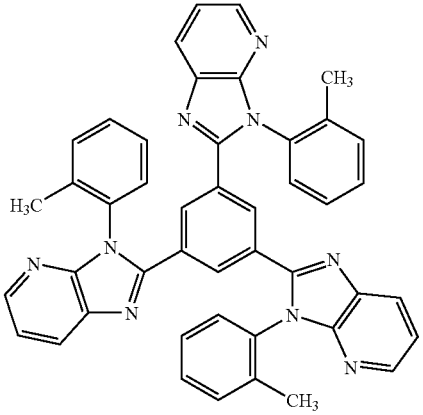

Compound C

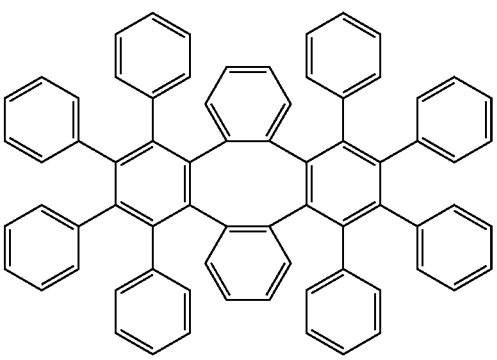

Compound D

DESCRIPTION OF REFERENCE NUMBERS USED IN THE DRAWINGS

1: anode, 2: hole injection layer, 3: hole transport layer, 4: light-emitting layer, 4a, 4b, 4c, 4d: unit light-emitting layers, 5: electron transport layer, 6: electron injection layer, 7: cathode, 8: intermediate layer, 8a, 8b, 8c: intermediate layers dividing light-emitting layer.

What is claimed is:

1. An organic electroluminescence element comprising at least a light-emitting layer interposed between a pair of electrodes, wherein:
   1) the light-emitting layer is divided into at least three layers in a thickness direction thereof, wherein each of the divided light-emitting layers independently contains a light-emitting material and a host material, and at least two intermediate layers each containing an electron blocking material and wherein the at least two intermediate layers are respectively disposed between and connect the divided light-emitting layers; wherein a first intermediate layer is closer to an anode and a second intermediate layer is closer to a cathode;
   2) an Ea (electron affinity) value of the electron blocking material contained in the first intermediate layer is smaller than an Ea value of the host material contained in the divided light-emitting layer adjacent on a cathode side of the first intermediate layer; and
   3) a difference $\Delta Ea_2$ value between an Ea value of the electron blocking material contained in the first intermediate layer closer to the anode and an Ea value of the host material contained in the divided light-emitting layer adjacent on the cathode side thereof is larger than a difference $\Delta Ea_1$ value between an Ea value of the electron blocking material contained in the second intermediate layer closer to the cathode and an Ea value of the host material contained in the divided light-emitting layer adjacent on the cathode side of the second intermediate layer.

2. The organic electroluminescence element according to claim 1, wherein a difference between the $\Delta Ea_2$ value and the $\Delta Ea_1$ value is 0.05 eV to 1.5 eV.

3. The organic electroluminescence element according to claim 1, wherein the light-emitting material of the divided light-emitting layer is a phosphorescent material.

4. The organic electroluminescence element according to claim 1, wherein the at least two intermediate layers contain a light-emitting material.

5. The organic electroluminescence element according to claim 4, wherein the light-emitting material contained in the at least two intermediate layers is a phosphorescent material.

6. An organic electroluminescence element comprising at least a light-emitting layer interposed between a pair of electrodes, wherein:
   1) the light-emitting layer is divided into at least three layers in a thickness direction thereof, wherein each of the divided light-emitting layers independently contains a light-emitting material and a host material, and at least two intermediate layers each containing a hole blocking material and wherein the at least two intermediate layers are respectively disposed between and connect the divided light-emitting layers; wherein a first intermediate layer is closer to an anode and a second intermediate layer is closer to a cathode;
   2) an Ip (ionization potential) value of the hole blocking material contained in the first intermediate layer is larger than an Ip value of the host material contained in the divided light-emitting layer adjacent on an anode side of the first intermediate layer; and
   3) a difference $\Delta Ip_2$ value between an Ip value of the hole blocking material of the first intermediate layer closer to the anode and an Ip value of the host material contained in the divided light-emitting layer adjacent to the anode side thereof is smaller than a difference $\Delta Ip_1$ value between an Ip value of the hole blocking material of the second intermediate layer closer to the cathode and an Ip value of the host material contained in the divided light-emitting layer adjacent to the anode side of the second intermediate layer.

7. The organic electroluminescence element according to claim 6, wherein a difference between the $\Delta Ip_1$ value and the $\Delta Ip_2$ value is 0.05 eV to 1.5 eV.

8. The organic electroluminescence element according to claim 6, wherein the light-emitting material in the divided light-emitting layer is a phosphorescent material.

9. The organic electroluminescence element according to claim 6, wherein the at least two intermediate layers contain a light-emitting material.

10. The organic electroluminescence element according to claim 9, wherein a light-emitting material contained in the at least two intermediate layers is a phosphorescent material.

* * * * *